United States Patent [19]
Waarts et al.

[11] Patent Number: 5,321,718
[45] Date of Patent: Jun. 14, 1994

[54] FREQUENCY CONVERTED LASER DIODE AND LENS SYSTEM THEREFOR

[75] Inventors: Robert G. Waarts, Palo Alto; David F. Welch, Menlo Park; Donald R. Scifres, San Jose; Robert J. Lang, Pleasanton; Derek W. Nam, Sunnyvale, all of Calif.

[73] Assignee: SDL, Inc., San Jose, Calif.
[21] Appl. No.: 10,279
[22] Filed: Jan. 28, 1993
[51] Int. Cl.$^5$ .................. H01S 3/08; H01S 3/10
[52] U.S. Cl. ............ 372/108; 372/21; 372/22; 372/23; 372/43; 372/50; 372/99; 372/101; 359/326; 359/328; 359/333; 359/344; 359/346
[58] Field of Search ............ 372/21, 22, 23, 43, 372/49, 50, 92, 96, 97, 98, 99, 101, 108; 359/333, 342, 343, 344, 346, 326, 328, 330, 332

[56] References Cited

U.S. PATENT DOCUMENTS

| | | | |
|---|---|---|---|
| 4,530,574 | 7/1985 | Scifres et al. | 350/420 |
| 4,744,089 | 5/1988 | Montroll et al. | 372/50 |
| 4,951,293 | 8/1990 | Yamamoto et al. | 372/21 X |
| 4,953,166 | 8/1990 | Mooradian | 372/21 |
| 5,003,550 | 3/1991 | Welch et al. | 372/50 |
| 5,088,105 | 2/1992 | Scifres et al. | 372/92 |
| 5,111,153 | 5/1992 | O'Mahony et al. | 372/21 X |
| 5,173,643 | 12/1992 | Andrews | 359/339 |
| 5,237,636 | 8/1993 | Harada | 372/21 X |
| 5,249,190 | 9/1993 | Kortz et al. | 372/21 X |
| 5,265,116 | 11/1993 | Mooradian | 372/21 X |
| 5,270,853 | 12/1993 | Bashkansky et al. | 359/326 |
| 5,278,851 | 1/1994 | Goto | 372/19 |

OTHER PUBLICATIONS

Kozlovsky, W. J. et al., "Generation of 41 mW of Blue Radiation by Frequency Doubling of a GaAlAs Diode Laser", Appl. Phys. Lett 56 (23), Jun. 4, 1990, pp. 2291–2292.

Lin, J. T., "Doubled Jeopardy: The Blue–Green Race's New Players" Lasers & Optronics, Dec. 1990, pp. 34–40.

Van der Poel, C. J. et al., "Efficient Type 1 Blue Second-Harmonic Generation in Periodically Segmented KTiOPO$_4$ Waveguides", Appl. Phys. Lett. 57 (20), Nov. 12, 1990, pp. 2074–2076.

Harada, A. et al., "Generation of Blue Coherent Light from a Continuous-Wave Semiconductor Laser Using an Organic Crystal-Cored Fiber", Appl. Phys. Lett. 59 (13), Sep. 23, 1991, pp. 1535–1537.

Rikken, G. L. J. A. et al., "Poled Polymers for Frequency Doubling of Diode Lasers", Appl. Phys. Lett. 58 (5), Feb. 4, 1991, pp. 435–437.

Goldberg, L. et al., "Blue Light Generation by Nonlinear Mixing of Nd:YAG and GaAlAs Laser Emission in a KNbO$_3$ Resonant Cavity", Appl. Phys. Lett. 56 (21), May 21, 1990, pp. 2071–2073.

Risk, W. P., "Fabrication and Characterization of Planar Ion-Exchanged KTiOPO$_4$ Waveguides for Frequency Doubling", Appl. Phys. Lett. 58 (1), Jan. 7, 1991, pp. 19–21.

Carts, Y. A., Assoc. Ed., "Nonlinear Conversion Refines Blue-Light Devices", Laser Focus World, May 1992, pp. 107–110.

Bosenberg, W. et al., "Parametric Optical Generation: from Research to Reality", Laser Focus World, May 1992, pp. 165–170.

*Primary Examiner*—Brain Healy
*Attorney, Agent, or Firm*—Schneck & McHugh

[57] ABSTRACT

A compact semiconductor laser light source providing short wavelength (ultraviolet, blue or green) coherent light by means of frequency doubling of red or infrared light from a high power diode heterostructure. The high power diode heterostructure is a MOPA device having a single mode laser oscillator followed by a multimode, preferably flared, optical power amplifier. A tunable configuration having an external rear reflector grating could also be used. A lens could be integrated with the MOPA to laterally collimate the light before it is emitted. Straight or curved, surface emitting gratings could also be incorporated. An astigmatism-correcting lens system having at least one cylindrical lens surface is disposed in the path of the output from the MOPA to provide a beam with substantially equal lateral and transverse beam width dimensions and beam divergence angles. A nonlinear optical crystal or waveguide is placed in the path of the astigmatism-free symmetrized beam to double the frequency of the light. Single pass or multipass configurations with reflectors could be used, as well as external resonator and segmented, periodically poled waveguide configurations.

119 Claims, 13 Drawing Sheets

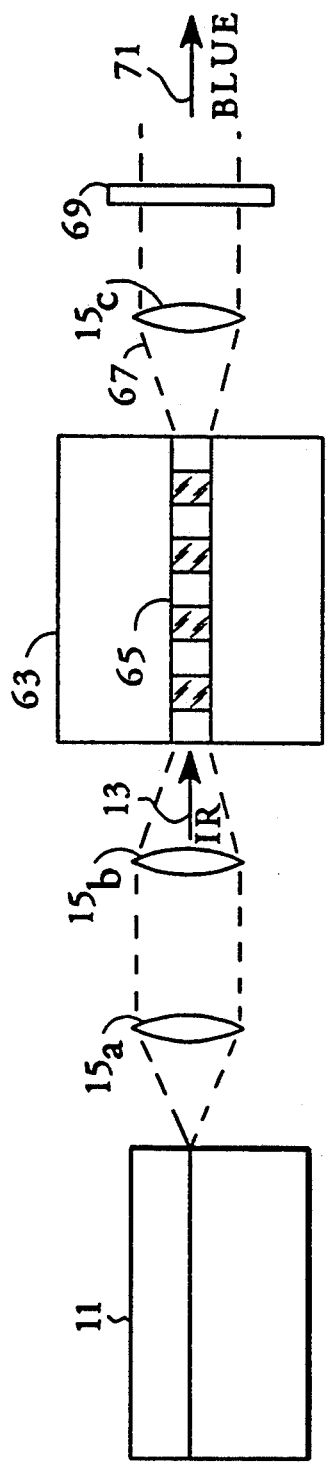
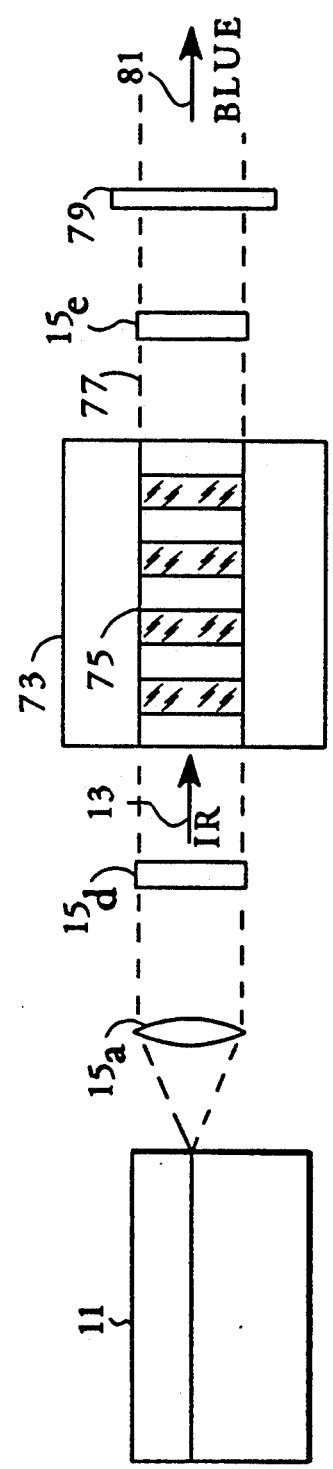
FIG. 7
FIG. 8

FREQUENCY CONVERTED LASER DIODE AND LENS SYSTEM THEREFOR

TECHNICAL FIELD

The present invention relates to semiconductor diode lasers whose red or near infrared light emission is converted to ultraviolet, blue or green laser light by means of a nonlinear optical device, such as by frequency doubling with a second harmonic generator (SHG). The invention also relates to high power laser diodes of the type known as master oscillator power amplifier (MOPA) devices, and especially to MOPAs with flared amplifiers.

BACKGROUND ART

Short wavelength (ultraviolet, blue, green) coherent light sources are desirable for a number of applications, including high density ($\approx 1$ Gbit/cm$^2$) optical data storage, color image processing, such as in laser printers, submicron lithography and other high resolution laser processing steps for fabricating VLSI devices, satellite-to-submarine and other underwater optical communications, and spectroscopy and other optical measurements, such as interferometric gravity-wave detection and the like. In many of these applications, compact laser systems are desired, and in some, relatively high output powers (greater than about 100 mW) are required. Accordingly, considerable effort has been undertaken in recent years to develop more compact, short-wavelength coherent light sources to replace the low-power air-cooled gas lasers, such as argon ion and helium-cadmium lasers, that are presently the only practical sources which are available.

Also, mid-infrared wavelength (2–10 $\mu$m) coherent light sources are desirable for a number of applications, including eye-safe laser ranging and communications, laser surgery, spectroscopy, environment sensing and diagnostics. Considerable effort has been undertaken to develop sources in the mid-infrared wavelength range.

Because of their compactness, high electrical-to-optical conversion efficiency, wavelength tunability and rapid modulation capabilities, semiconductor laser diodes are being actively studied to discover whether shorter wavelengths can be generated. At present, AlGaInP lasers have the shortest practical limit of wavelength around 600 nm (orange). Potential wide bandgap semiconductor lasers made of AlGaN or other materials are being studied, but have not yet been successfully oscillated by current injection. At present, approaches to directly generating mid-infrared wavelengths are focused on rare-earth doped solid state lasers, such as thullium (Tm) and holmium (Ho) doped lasers.

Nonlinear optical processes, such as frequency doubling (also called second harmonic generation) and sum frequency mixing, are capable of converting red and near infrared light into ultraviolet, blue and green light. Accordingly, much development work has focused on using nonlinear frequency conversion techniques to generate ultraviolet, blue and green light directly from red and near infrared laser diodes. Direct frequency doubling of laser diode emission makes possible the extension of available diode laser wavelengths into the ultraviolet, blue and green regions of the spectrum, and represents at present the most feasible approach to developing a compact, efficient, high power coherent source in those spectral regions. However, in order for this approach to be successful and useful in practical applications, like those mentioned above, higher optical conversion efficiencies from the red and near infrared laser diode wavelengths to the desired ultraviolet, blue and green wavelengths are needed. Likewise, other nonlinear optical processes, including optical parametric generation and difference frequency mixing, are capable of generating mid-infrared radiation from one or two shorter-wavelength sources. Again, improved conversion efficiencies are needed to make these techniques practical.

In general, higher optical conversion efficiencies are associated with a higher power density or intensity of the fundamental pump wavelength within the nonlinear optical material. Because of the relatively low powers available from most diode lasers, configurations using external resonators or channel waveguide structures have been preferred. For example, efficient frequency conversion is possible by coupling laser diode radiation into a passive external resonator of either a standing wave or unidirectional ring type that contains a bulk crystal of nonlinear optical material, such as potassium titanyl phosphate (KTiOPO$_4$) or potassium niobate (KNbO$_3$). The high circulating intensity that builds up in the crystal located within the resonator results in efficient frequency conversion of the laser diode radiation.

W. J. Kozlovsky, et al., in *Applied Physics Letters* 56 (23), pages 2291–2292 (1990), describe frequency doubling of an 856 nm laser output from a ridge waveguide, single quantum well, graded index double heterostructure GaAlAs diode laser in a monolithic KNbO$_3$ crystal ring resonator in order to generate 428 nm (blue) radiation. The ring resonator is a 7 mm long KNbO$_3$ crystal with curved mirror end faces coated for high reflectivity at the fundamental wavelength and transmissivity of the frequency doubled blue light and with a flat total internal reflection surface parallel to the mirror axes. The crystal resonator is placed on a thermoelectric cooler so that the temperature can be stabilized at 15° C. for phase-matched second harmonic generation along the long direction of the ring path. In order to achieve efficient power buildup in the KNbO$_3$ cavity and generation of stable blue output, the laser output frequency is locked to the cavity resonance using an elaborate electronic servo technique that superimposes a small rf current on the dc injection current to produce weak FM sidebands in the laser output and that uses a double-balanced mixer for phase sensitive detection of the optical-heterodyne-spectroscopy signal in the light reflected from the input surface of the resonator. Such a signal is zero when the carrier frequency coincides with the cavity resonance. The output signal of the mixer is amplified and coupled back to the laser injection current, so that the diode laser's output frequency tracks the resonance frequency of the KNbO$_3$ cavity. Using such a servo technique, a 41 mW blue output (39% optical conversion frequency) was achieved. However, the technique requires a significant amount of electronics for it to work properly without amplitude noise. Elaborate temperature and electronic feedback controls for matching resonance frequencies are typical of external resonator systems. Besides being expensive and not very compact, in attempting to maintain stable operation, they usually introduce some wavelength jitter into the system.

J. T. Lin, in *Lasers and Optronics*, December 1990, pages 34–40, describes diode-pumped self-frequency-doubling (SFD) lasers using $Nd_xY_{1-x}Al_3(BO_3)_4$ (NYAB) crystals for the frequency doubling, and compares them against prior single-pass KTP, external resonator $KNbO_3$ and channel waveguide $LiNbO_3$ second harmonic generator configurations for diode lasers, as well as other frequency doubled laser systems. Up to 80 mW of output power (up to 8.0% efficiency) at 531 nm is achieved with NYAB compared to 40 mW of output power at 430 nm for external-resonator-type second harmonic generation of a 860 nm diode laser beam. Like diode-pumped solid-state lasers, these SFD laser systems are not particularly compact, so that a tradeoff between compactness and greater conversion efficiency must be made.

Another approach for efficient frequency conversion is to use ion-diffused channel waveguides of nonlinear optical material, such as lithium niobate ($LiNbO_3$) or potassium titanyl phosphate ($KTiOPO_4$), to double the frequency of the laser diode emission. Doubling is relatively efficient if the waveguide is relatively long (greater than about 1 mm), but phase-matching of long frequency-doubling waveguides is critical, the available wavelength range is more limited, and fabrication tolerances are tight. Periodic poling can ease such requirements and increase efficiency. Another problem that arises when waveguide systems are used is that it is difficult to collimate and then focus the diode laser light to a diffraction-limited spot for efficient coupling into the waveguide, using conventional spherical lens systems. However, waveguide systems are compact.

C. J. Van der Poel, et al., in *Applied Physics Letters* 57 (20), pages 2074–2076 (1990), describe second harmonic generation in periodically segmented $KTiOPO_4$ (KTP) waveguide structures. The waveguide structures are formed in either flux-grown or hydrothermally grown KTP substrates by ion exchange through a Ti mask using various Rb/Tl/Ba nitrate molten salt baths. There are two segments per period, one segment being bulk KTP with a length $l_1$ and a propagation constant mismatch $\Delta k_1$, the other segment being an ion-exchanged KTP waveguide with a length $l_2$ and a propagation constant mismatch $\Delta k_2$, in which the phase-matching condition $\Delta k_1 l_1 + \Delta k_2 l_2 = 2\pi M$ is met (M being an integer). Ferroelectric domain reversals in adjacent segments can also be included for higher conversion efficiencies. Efficient second harmonic outputs were observed from 0.38 µm (deep purple) to 0.48 µm (blue-green). W. P. Risk, in *Applied Physics Letters* 58 (1), pages 19–21 (1991), describes fabrication of optical waveguides in KTP crystals by an ion-exchange process involving a molten Rb/Ba nitrate bath. Second harmonic generation from titanium:sapphire laser light in the 900–1000 nm range was observed.

A. Harada et al., in *Applied Physics Letters* 59 (13), pages 1535–1537 (1991), describe second harmonic generation of 442 nm (blue) light from an 884-nm semiconductor laser using an organic crystal-cored nonlinear optical fiber coupled to the laser. The single transverse mode fundamental beam of the diode laser is collimated by a first objective lens and an anamorphic prism pair, and then focused into the fiber by a second objective lens. The fiber was formed by filling a hollow glass fiber by capillary action with the organic material (DMNP) melt, and then recrystallizing the polycrystals thus obtained by the Bridgman-Stockberger single crystal formation method in which the fiber is pulled out of a 105° C. furnace. The fiber core diameter and length are 1.4 µm and 5–14 mm, respectively. Output powers of 0.16 mW (about 1.6% conversion efficiency) were achieved. G. L. J. A. Rikken, et al., in *Applied Physics Letters* 58 (5), pages 435–437 (1991), describe nonlinear optical effects in sidechain copolymers with methylmethacrylate.

Efficient frequency conversion also requires good spatial and spectral mode properties of the diode lasers. While greater light intensities in the nonlinear material are desired, too much power focused in one place can damage or destroy the nonlinear material. Poor spatial mode characteristics of the diode laser beam can limit the amount of focusing that can safely be achieved without damage to the nonlinear material. Higher power lasers, such as multi-emitter and broad area laser diodes are a particular problem because of their highly asymmetric beam characteristics.

In U.S. Pat. No. 4,530,574, Scifres et al. describe an optical system for collimating and focusing the radiation emitted from a multi-emitter or broad emitter semiconductor laser so that the laser beam or beams can be imaged into a single diffraction limited spot. The optical system includes a first lens system to collimate or focus the radiation in the near field in the vertical direction perpendicular to the p-n planar junction, and a second lens system to collimate or focus the radiation in the far field in the lateral emission direction parallel to the p-n planar junction. Unwanted low power interference lobes may be blocked by using an aperture in the optical system.

An object of the invention is to provide a high power (greater than 100 mW), short wavelength (ultraviolet, blue or green), compact laser source.

Another object of the invention is to provide a laser source utilizing a lens system that can collimate and focus the highly asymmetric and astigmatic beams of higher power laser diode systems into a diffraction limited-beam for coupling into nonlinear, frequency converting optical material.

DISCLOSURE OF THE INVENTION

The objects have been met with a compact semiconductor laser light source having at least one master oscillator power amplifier (MOPA) type or flared resonator type laser diode for generating one or more high power coherent light beams of at least a first wavelength and an optical frequency converter positioned to receive the beam or beams from the high power laser diode or diodes for generating an output light beam of a different wavelength from a portion of the optical power of the beam or beams from the laser diode or diodes. The MOPA type laser diode preferably includes a single mode, tunable DBR laser oscillator coupled to a multimode, preferably flared, power amplifier region. By removing the internal DBR grating from the laser oscillator, the flared amplifier region itself can be made to oscillate as an at most marginally stable resonator with spatial mode filter and to produce a high power diffraction limited output beam. Both the MOPA type laser diode and the flared resonator type laser diode are capable of generating at least 1 W cw of red or near-infrared light output for high efficiency frequency conversion. Because optical conversion efficiency increases with the square of the incident optical power, the system can use a single-pass or nonresonant multi-pass configuration with a bulk crystal of optically nonlinear material, and still obtain efficient frequency doubling. A passive external resonator with the nonlinear material located within the resonant optical cavity, with its associated resonance matching electronics, becomes optional. Likewise, the use of a nonlinear material optical waveguide, with or without periodic ferroelectric polarization domain reversals, becomes unnecessary and is now optional. Frequency conversion techniques include frequency doubling and optical parametric generation using one input beam and sum frequency mixing and difference frequency mixing using two input beams.

The objects are also met with a compact semiconductor laser light source that includes an astigmatism-correcting lens system positioned in the path of the light beam that is output from either of the MOPA type or flared resonator type laser diode devices. The multi-mode, preferably flared, optical power amplifier region, which is coupled to a single mode laser oscillator in MOPA type devices, generates an astigmatic beam with a beam waist in the lateral direction located at the input end of the amplifier region and another beam waist in the transverse direction which is located at the output surface of the MOPA device. Here, 'lateral' and 'transverse' refer to directions respectively parallel and perpendicular to a plane of an active gain region of the MOPA or flared resonator device. The light beam emitted from the MOPA or flared resonator device is also highly asymmetric with different lateral and transverse beam width dimensions and different lateral and transverse beam divergence angles. The lens system has at least one nonspherical lens element located where the two beam width dimensions are equal for independently equalizing the lateral and transverse characteristics of the beam. A lens could also be incorporated into the MOPA or flared resonator device or a curved surface emitting output grating could be integrated into the MOPA or flared resonator device. The laser diode-lens system combination is particularly valuable for coupling the high power light at high intensity into the nonlinear optical material used for frequency conversion. Because the spatial mode quality of the lens-system-corrected beam is very good, higher intensities can be produced in the nonlinear material with less danger of damaging the material. Coupling of the high power laser beam into a nonlinear optical waveguide can be achieved with less loss when the astigmatism-correcting lens system is employed.

BRIEF DESCRIPTION OF THE DRAWINGS

FIGS. 1-4, 5A and 6-8 are schematic side views of eight embodiments of the present invention, differing principally in the manner in which the light beam from the high power laser diode passes through the various nonlinear optical converter configurations in these embodiments.

FIGS. 11A-18A and 11B-18B are respective side and top plan views of four MOPA device/astigmatism-correcting lens system embodiments of the present invention which are useful in any of the frequency converting embodiments shown in FIGS. 1-8.

BEST MODE FOR CARRYING OUT THE INVENTION

Figure 1:
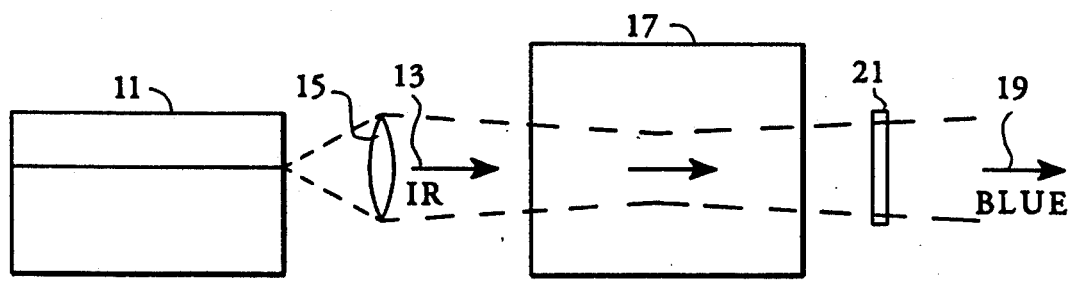

With reference to FIG. 1, a semiconductor laser of the present invention includes a master oscillator power amplifier (MOPA) type or flared resonator type laser diode which is capable of generating a high power coherent light beam 13 having a wavelength in the red or near-infrared region of the spectrum. A lens system 15, here represented for simplicity as a single lens, but more typically being a multi-lens system such as those seen in FIGS. 11-18, collimates the diverging light 13 from the high power laser diode 11 and possibly focuses the light as well. In most embodiments, it is necessary for the beam not only to be collimated, but made symmetric as well. The collimated or collimated and focussed light beam 13 is coupled into a nonlinear optical frequency converter 17, which is positioned to receive the high power coherent light beam 13 from the laser diode 11. The optical frequency converter 17 is capable of generating a second light beam 19 having a wavelength in the ultraviolet, blue or green range of the spectrum from a portion of the optical power of the first beam 13. The second beam 19 has a wavelength which is different from that of the injected beam 13. A dichroic filter 21 may be placed at the output of optical frequency converter 17 to block the red or near-infrared fundamental light to pass the converted ultraviolet, blue or green light as the output of the laser source.

The configuration shown in FIG. 1 is a single pass second harmonic generation or frequency doubling configuration in which the nonlinear optical frequency converter is a bulk crystal of nonlinear optical material. The nonlinear crystalline material may be potassium titanophosphate ($KTiOPO_4$), potassium niobate ($KNbO_3$), barium metaborate ($BaB_2O_4$), lithium triborate ($LiB_3O_5$), neodymium yttrium aluminum borate ($Nd_xY_{1-x}Al_3(BO_3)_4$, as well as various organic nonlinear optical materials. In this single pass configuration the high power laser diode light is focused in the nonlinear crystal 17. The spot size of the infrared beam 13 in the crystal is optimized for maximum single pass conversion efficiency by focusing the beam to the smallest possible spot size such that the beam still remains focused over the length of the crystal. In the case of a potassium niobate bulk crystal with a length of 1 cm and a 1 Watt infrared input 13 from the laser diode 11, the output power of the blue frequency doubled beam 19 is about 10-20 mW. Using longer crystals the second harmonic generated output can be increased since the conversion efficiency increases linearly with the crystal length. However, crystal lengths are currently available only up to about 2 cm.

Figure 2:
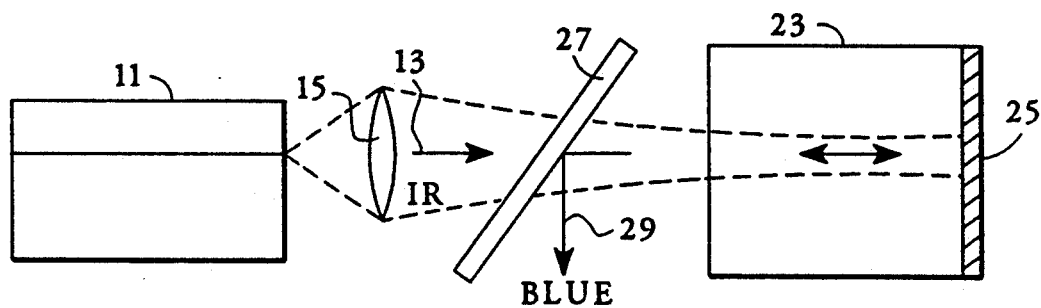

With reference to FIG. 2, another embodiment of the present invention employs a double pass configuration. Again, a MOPA type or flared resonantor type laser diode 11 emits a red or near infrared beam 13 which is collimated and focused by a lens system 15. The high power laser diode beam 13 is focused into a nonlinear crystal 23. The nonlinear crystal 23 has a reflective coating 25 integrated on a surface which is opposite from the input side that receives the beam 13. The coating 25 reflects the infrared light from the beam 13 as well as the frequency doubled blue light generated by the nonlinear crystal material 23. A beamsplitter 27 which is transmissive of the infrared light 13 but reflective of the frequency doubled light 29 is positioned in the return path of the light beam between the lens system 15 and the nonlinear crystal 23 in order to couple the frequency doubled blue light 29 out of the laser system. Care should be taken that the phase of the reflection from the mirror 25 is the same for the infrared and the second harmonic generated beam to prevent phase mismatch and reduced output efficiency. In order to optimize the focusing in the crystal, the reflector 25 is preferably curved. Assuming double pass transmission through a 2 cm long potassium niobate crystal and 1 Watt of infrared input, about 40–80 mW cw output power can be obtained.

Figure 3:
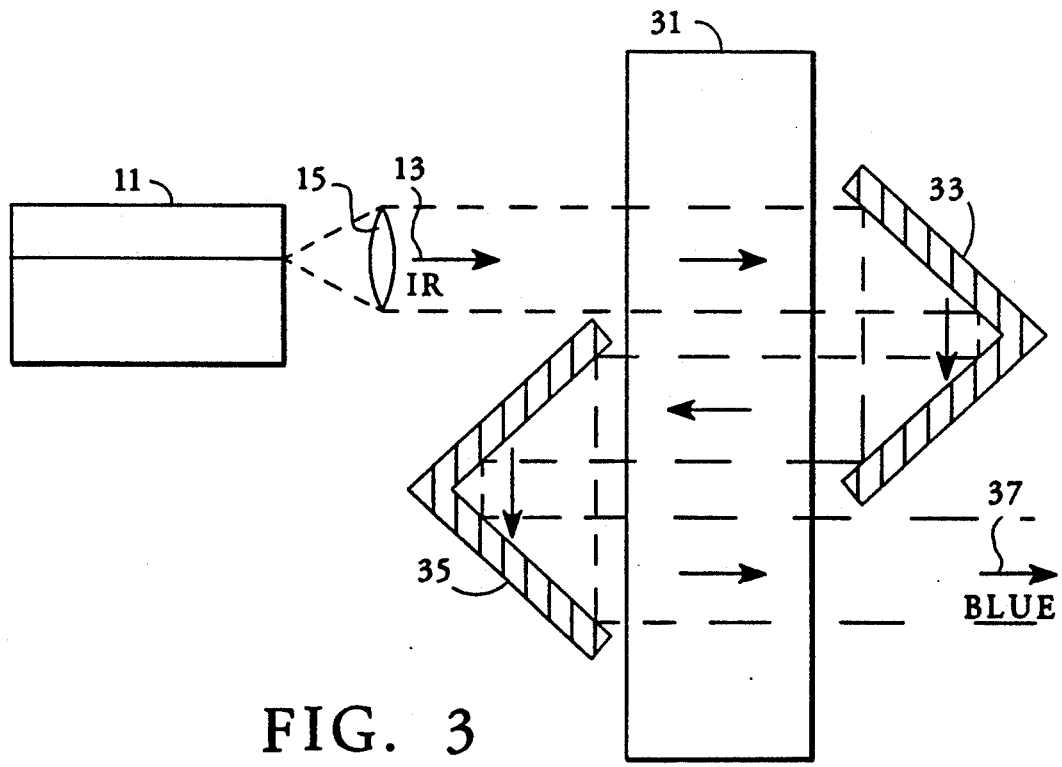

With reference to FIG. 3, a multiple pass second harmonic generator configuration is seen. A MOPA type or flared resonator type laser diode 11 capable of generating a high power coherent red or near infrared light beam 13 and a lens system 15 are combined to collimate and possibly focus the red or near infrared beam 13 into a nonlinear crystal 31. Retroreflectors 33 and 35 are used to reflect the beam back through the nonlinear crystal 31 in a parallel direction so as to remain properly angle tuned for phase match interaction. The advantage of this retroreflected configuration is that the interaction length in the nonlinear crystal 31 can be increased without increasing the crystal length. Assuming 1 Watt of infrared light 13 input into a 1 cm long nonlinear crystal 31 in a configuration that includes 10 passes of the light 13 through the crystal 31, the effective interaction length is 10 cm and 100–200 mW of second harmonic generated blue light 36 can be obtained.

Figure 4:
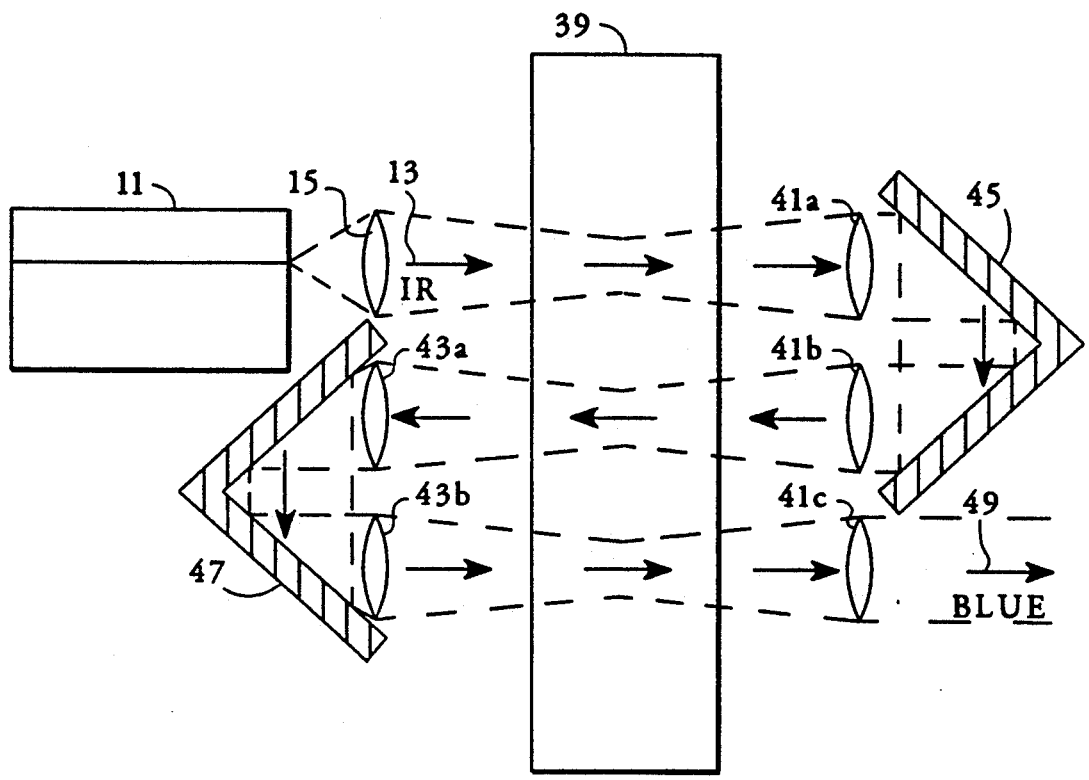

With reference to FIG. 4, a focused multiple pass configuration could be used. Again, a MOPA type or flared resonator type laser diode 11 and a lens system 15 produce a high power, collimated and focused, laser beam 13 of red or infrared wavelength. The focused light beam 13 is coupled into a nonlinear optical crystal 39. Retroreflectors 45 and 47 direct the beam 13 back through the nonlinear crystal 39 along a parallel path so that the beam 13 passes through the crystal 39 a plurality of times. This arrangement also includes a pair of lens arrays 41a, 41b, 41c, etc. and 43a, 43b, 43c, etc. for focusing the light on every pass through the nonlinear crystal 39. Here lens elements 41a, 43a, 41c, etc. positioned in the beam path after passage through the nonlinear crystal 39 collimate the light beam for retroreflection off of right angle mirrors 45, 47, etc., while lens elements 41b, 43b, etc. positioned in the path of the retroreflected beam prior to passage through the nonlinear crystal refocuses the beam into the nonlinear crystal. The focused beam waist is preferably located in the center of the nonlinear crystal 39 equidistant between the two lens arrays 41 and 43. Using this focused configuration, the effective interaction length varies at the length of the nonlinear crystal times the square of the number of passes. Thus, a 1 cm long nonlinear crystal 39 receiving 1 W of infrared input 13 from a MOPA device 11 with 3 passes of the beam, as shown, has an effective interaction length of 9 cm and provides a second harmonic generated input beam 49 with about 90–180 mW power.

Figure 5A:
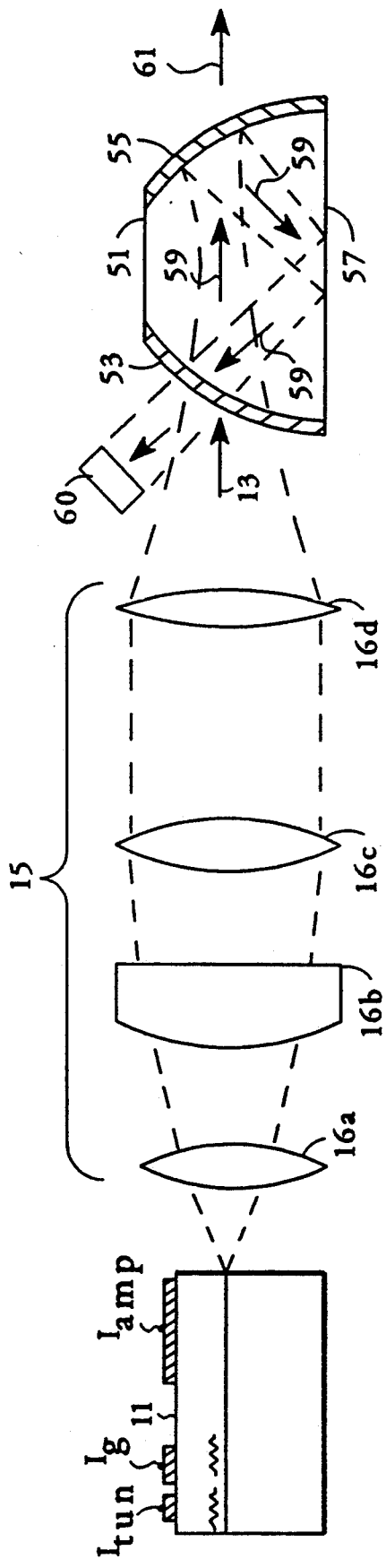
Figure 5B:
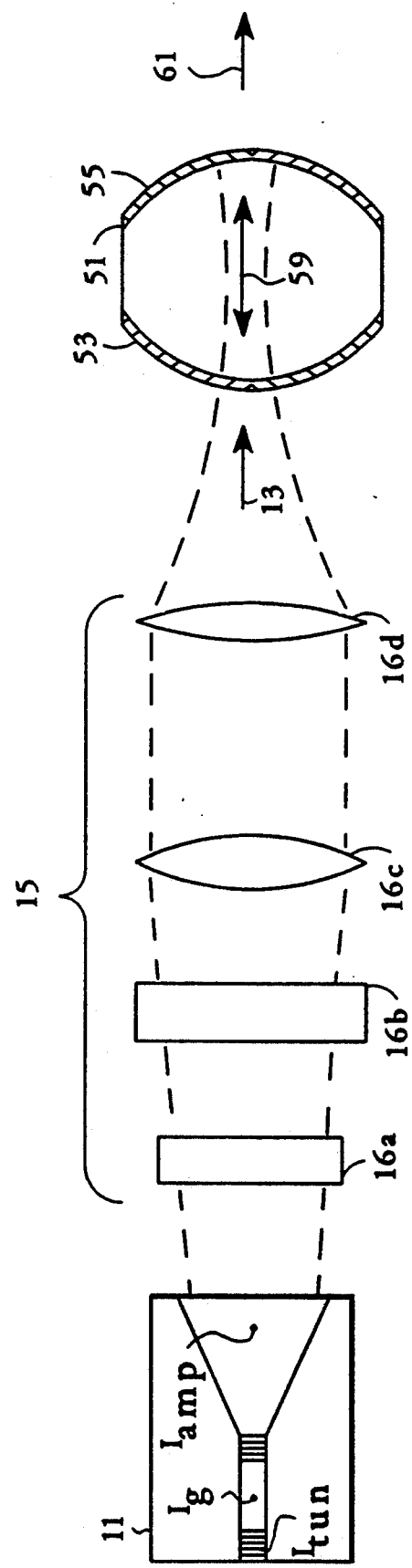
FIG. 5B is a top plan view of an embodiment of the present invention corresponding to the side view seen in FIG. 5A.

With reference to FIGS. 5A and 5B, the nonlinear crystal 51 may be placed in a passive external resonator to further enhance the conversion efficiency. A MOPA type laser diode 11 (alternatively a flared resonator type laser diode) provides a high power beam 13 which is collimated then focused by a lens system 15. The lens system 15 may include a fixed position cylinder fiber lens 16a, a second, variable position cylinder lens 16b, a variable position aspherical collimating lens 16c and a spherical focusing lens 16d. Details of astigmatism correcting lens systems 15 for use in the invention are described further below With reference to FIGS. 11-19. The nonlinear crystal 51 is positioned in the path of the focused beam 13 for receiving it. Crystal 51 has reflective coatings 53 and 55 on two opposed input and output surfaces, which are tilted slightly away from the perpendicular direction in the manner of a trapezoid and preferably curved to maintain focusing of the light 59 in the ring. A third surface 57 parallel to the principal light direction between coated surfaces 53 and 55 forms a totally internally reflecting surface. The light path 59 in the nonlinear crystal 51 describes a unidirectional ring. Reflective coating 53 on the output surface is highly reflective of the red or infrared fundamental wavelength of light 13 received from laser diode 11 and transmissive of the frequency doubled ultraviolet, blue or green light 61 generated by the nonlinear optical crystal 51. Reflective coating 55 is preferably reflective of the frequency doubled light generated in the crystal 51 and has a reflectivity to the fundamental wavelength which is optimized to maximize the optical power gain from light input by transmission of beam 13 through the coating 55 and fundamental wavelength light loss by transmission of beam 59 through the coating 55. The resonant cavity provided by the reflective surfaces 53, 55 and 57 increases the power in the crystal 51 and increases second harmonic output power by the square of the incident power on the crystal 51. Given a 1 W input power from beam 13, the Q of the cavity can be relatively low compared to resonant cavities that are designed for 100 mW type laser diodes. This low Q will make the operation of the cavity easier, leading to a stable output 61 without amplitude noise or frequency jitter. The laser emission 13 can be maintained at a wavelength $\lambda_1$ that is tuned to the cavity resonance in the nonlinear crystal 51 by adjusting a tuning current $I_{tun}$ applied to the laser diode 11 using an electronic servo tuning system like that described above in the Background Art section with respect to the Kozlovsky article. The applied tuning current $I_{tun}$ is based on a feedback loop signal derived from a detector 60 with an rf response.

Figure 6:
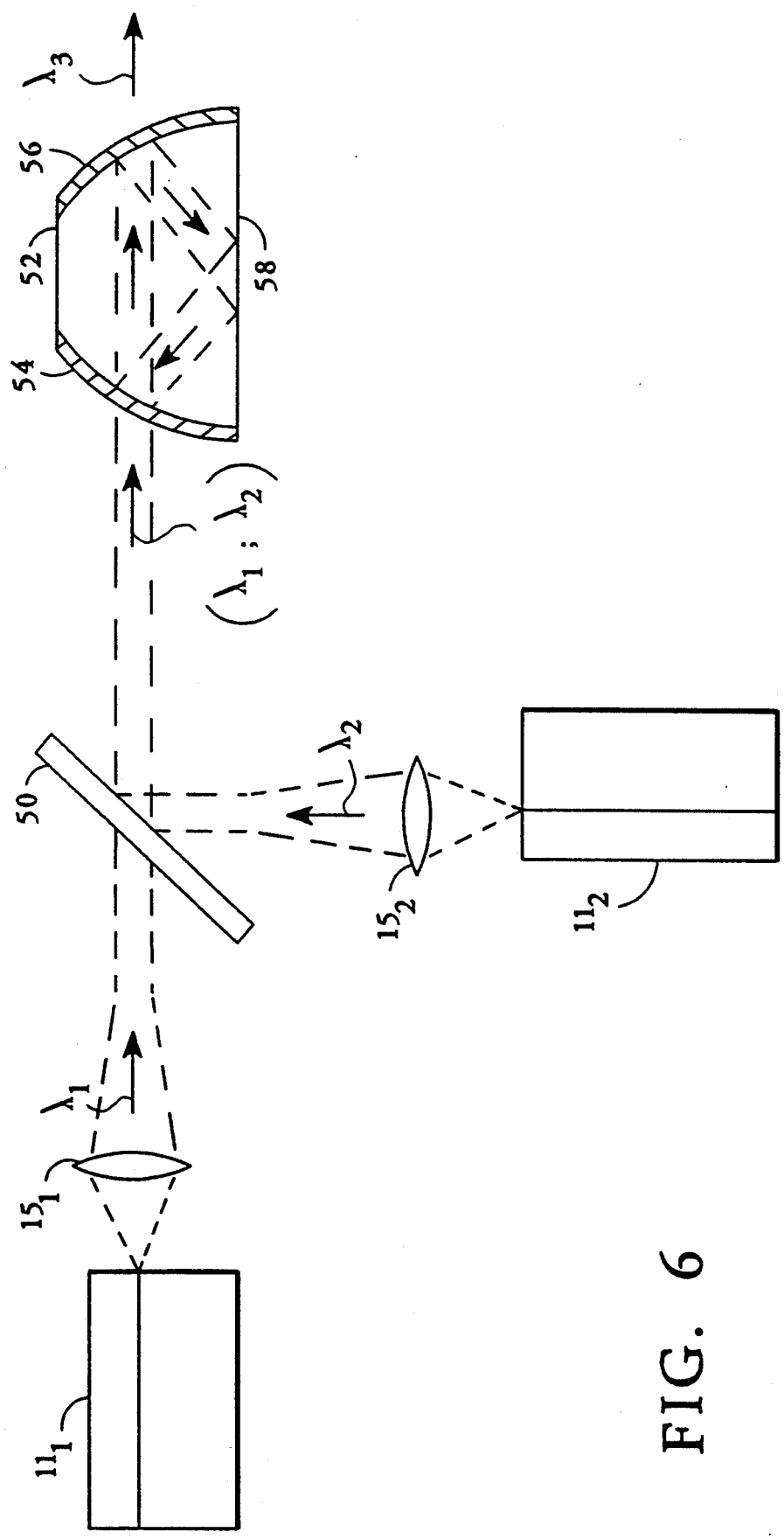

With reference to FIG. 6, high power laser diodes of the MOPA or flared resonator types could also be used in frequency converting configurations that use sum or difference frequency mixing (SFM or DFM) to achieve desired wavelengths with useful efficiency. In FIG. 6, two such high power laser diodes $11_1$ and $11_2$ are tuned to emit light of different wavelengths $\lambda_1$ and $\lambda_2$. The light is collimated and focused by a set of lens systems $15_1$ and $15_2$ for each diode $11_1$ and $11_2$ then combined using a dichroic beamsplitter 50 into a single common light path. The combined beam of both wavelengths $\lambda_1$ and $\lambda_2$ is received by a nonlinear crystal 52, which is here shown as an external ring resonator with reflective crystal surfaces 54, 56 and 58 but which could also be any of the other configurations shown in FIGS. 1-5, 7 and 8. Difference frequency mixing of the two wavelengths $\lambda_1$ and $\lambda_2$ will produce a mid-infrared output of wavelength $\lambda_3 = \lambda_1\lambda_2/|\lambda_2 - \lambda_1|$, while sum frequency mixing will produce blue or green light of wavelength $\lambda_3=\lambda_1\lambda_2/(\lambda_1+\lambda_2)$. The reflective properties of mirror surfaces 54 and 56 can be selected to enhance one of these two frequency conversion operations. The nonlinear material can also be phase-matched at the sum or difference frequency, as in the waveguide configurations in FIGS. 7 and 8 discussed below.

Further, some nonlinear crystal materials, including lithium niobate ($LiNbO_3$), potassium titanal phosphate ($KTiOPO_4$), silver gallium sulfide ($AgGaS_2$) and silver gallium selenide ($AgGaSe_2$), are especially suited to efficient generation and transmission of the mid-infrared wavelengths of the DFM conversion technique.

With reference to FIG. 7, nonlinear second harmonic generating waveguides 65 might also be used with the MOPA type or flared resonator type laser diode 11. The high power red or near-infrared beam 13 emitted from the laser diode 11 is collimated by an astigmatism-correcting lens system 15a, like those seen in FIGS. 10–13, then focused by additional lens elements 15b, typically a single spherical lens, to a small spot on the entrance to the narrow single mode waveguide 65 in the nonlinear crystal 63. Because of the narrow waveguide 65, typically about 3 $\mu$m wide, the light remains focused with a small width over the full interaction length of the crystal 63. The nonlinear single mode waveguide 65 preferably is a regularly segmented waveguide formed by ion exchange through a mask, using a molten salt bath or proton implantation to introduce the ions to be substituted in the crystal lattice. The nonlinear crystal material may be lithium niobate ($LiNbO_3$), potassium niobate ($KNbO_3$), potassium titanyl phosphase ($KTiOPO_4$) or some other non-linear optical material. Periodic ferroelectric polarization domain reversals are preferred for optimum conversion efficiency. Assuming a typical optical conversion efficiency of 100%-$W/cm^2$ for second harmonic generation and neglecting pump depletion effects, a phase-matched or quasi-phase-matched crystal length of 1 cm and a 1 W input power for the beam 13 from a MOPA device 11 will provide nearly complete conversion of the fundamental input wavelength to the frequency doubled wavelength. The output 67 from the waveguide 65 is collected and collimated by lens elements 15c, typically a single spherical lens. A dichroic filter 69 may be placed in the path of the output beam 67 from the waveguide 65 to block any red or near-infrared light from input beam 13 that still remains unconverted and to pass only the frequency doubled ultraviolet, blue or green light 71 as the output.

With reference to FIG. 8, the nonlinear waveguide 75 may also be a multimode waveguide which is tens of micrometers wide as compared to the typical 3 $\mu$m width for the single mode waveguide 65 in FIG. 6. Because of the high input power of the red or near-infrared beam 13 received from the MOPA type or flared resonator type laser diode 11, the conversion efficiency of the broader waveguide 75 can still be very high, even though the optical pump power is less confined than the single mode waveguide case. The beam 13 emitted from the laser diode 11 is collimated by the astigmatism-correcting lens system 15a then focused in only one of two orthogonal directions by an additional cylinder lens 15d onto the entrance of the multimode nonlinear waveguide 75. An advantage of the configuration is that the optical power density within the waveguide 75 is lower than in the single mode waveguide 65 of FIG. 7, and therefore there is less chance of photorefractive damage. Further, because of the width of the beam 13, the beam will remain collimated in wide direction such that very little waveguiding effect by the waveguide 75 will be necessary in that direction. Again, the waveguide 75 can be a regularly segmented, periodically poled waveguide for efficient second harmonic generation. The output 77 from the waveguide 75 is allowed to reexpand in the narrow direction then collimated by another cylinder lens element 15e. A dichroic filter 79 can be used to block any remaining unconverted red or near-infrared light and to pass only the frequency doubled ultraviolet, blue or green light beam 81 generated in the nonlinear waveguide 75.

Figure 9:
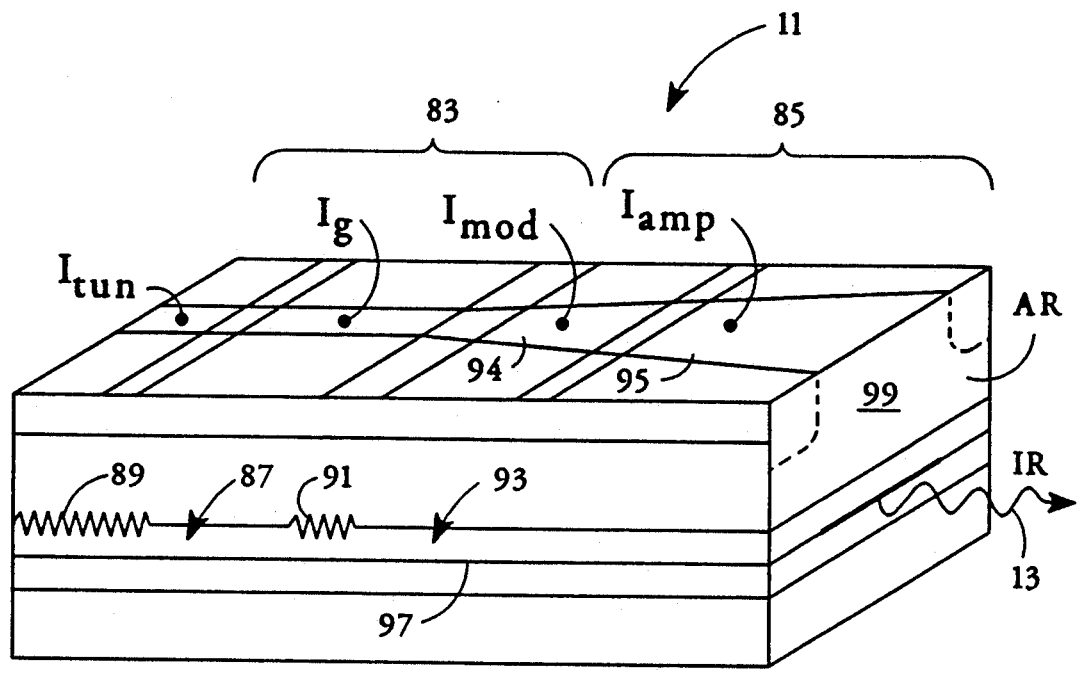
FIG. 9 is a perspective view of a master oscillator power amplifier (MOPA) type laser diode for use in any of the embodiments shown in FIGS. 1-8.

With reference to FIG. 9, a MOPA type laser diode 11 providing a high power red or near-infrared coherent beam 13 is used in each of the frequency converting configurations shown in FIGS. 1–8. Typically, the MOPA device 11 emits 1 W cw of single frequency optical power. Alternatively, the MOPA device 11 would be operated in a pulsed mode to provide about 3 W peak output power for even higher conversion efficiencies than the continuous wave (cw) mode of operation. A preferred MOPA device capable of generating such power levels comprises a low power, single-mode DBR laser oscillator 83 which is monolithically integrated with a multimode, preferably flared, power amplifier region 85. A typical power output from the laser oscillator section 83 is about 50 mW. The laser oscillator has a single mode waveguide 87 driven by an electrical pump current $I_g$ and bounded by a pair of grating reflectors 89 and 91 defined in a layer interface proximate to the waveguide layers 87 so as to interact with lightwaves propagating therein and form an optical resonator. The highly reflective rear grating reflector 89 may be wavelength tunable by means of an injection current $I_{tun}$ or electrical bias applied across the grating region. The front grating reflector 91 is partially transmissive to the propagating light in the waveguide 87 to couple the light into the amplifier region 85. The amplifier region has waveguiding layers 93 that are driven by at least an amplifier current $I_{amp}$ applied through the conductive surface contact 95. Light coupled from the laser oscillator 83 into the waveguiding layers 93 of the amplifier region 85 are allowed to freely diffract in the lateral direction parallel to the plane of the active region 97 as it propagates toward the AR-coated output facet 99.

In FIG. 9, the amplifier region 85 has two split contacts 94 and 95 for optimization of the current density as a function of the length of the flare. The wider front half of the amplifier region 85 could thus be pumped with a greater amplifier current $I_{amp}$ and current density than the narrower back half of the amplifier region 85 near the laser oscillator 83. Such differential pumping reduces amplitude noise in the output signal 13, and also improves the spatial mode quality of the output since optical filamentation is minimized. Another advantage of the split contacts 94 and 95 is that the MOPA device 11 can be modulated by means of a modulation current $I_{mod}$ applied to the first part of the flared amplifier 85 through contact 94. Output power can then be modulated without inducing wavelength chirp in the laser oscillator output, which would adversely affect phase matching in a nonlinear crystal. Further, modulation can then be accomplished at gigahertz frequencies with only modest input current $I_{mod}$, since the optical power on the narrow end of the flared amplifier region 85 is still only a few hundred milliwatts.

Figure 10:
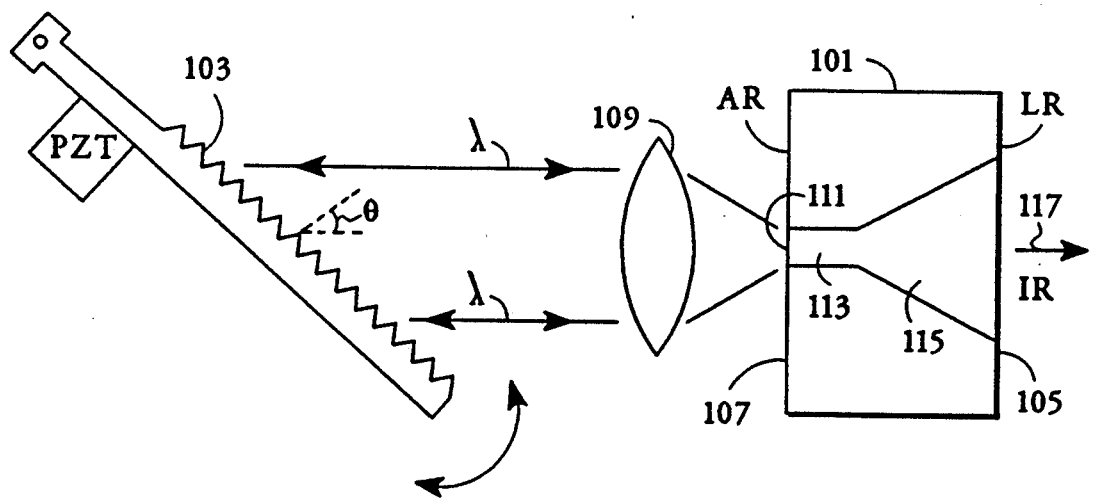
FIG. 10 is a top plan view of an alternative flared resonator type laser diode for use in any of the embodiments shown in FIGS. 1-8.

With reference to FIG. 10, an alternative high power laser source that could be used for frequency doubling is a flared resonator type laser diode that includes a light amplifying diode heterostructure 101 located within an at most marginally stable resonant optical cavity defined by a tunable grating reflector 103 and a low reflection front end facet 105 of the heterostructure 101. The rear end facet 107 of the heterostructure 101 is antireflection (AR) coated to prevent self-oscillation of the heterostructure 107. A lens 109 between the grating reflector 103 and AR coated rear facet 107 of the heterostructure 101 receives light emitted from a narrow single-mode aperture 111 defined by a waveguide 113 in the heterostructure 101 and collimates it, directing the light toward the grating reflector 103 at an incidence angle $\Theta$. The single mode aperture 111 forms a spatial mode filter for the light oscillating in the cavity. The lens 109 also receives the reflected light back from the grating reflector 103 and focuses it upon the rear facet 107, coupling light of a particular wavelength $\lambda$, corresponding to the incidence angle $\Theta$ of light on the grating 103 through the narrow aperture 111 into the single mode waveguide 113. The heterostructure 101 has a flared gain region 115 which is electrically pumped to amplify the light received from the waveguide 113 as it freely diffracts within the flared gain region 115. A coherent red or near infrared light beam 117 of wavelength $\lambda$ is emitted from the front facet 105 of the heterostructure 101.

Each of the high power coherent sources in FIGS. 9 and 10 are useful for providing red or near infrared light for efficient frequency doubling. Diode laser sources of GaAs/InGaAs composition are capable of providing light ranging from 780 nm to 1030 nm in wavelength. Using periodically poled nonlinear waveguides like those shown in FIGS. 7 and 8, the complete range of wavelengths provided by these sources can be doubled to provide ultraviolet, blue and green light in the range from 390 nm to 515 nm. Using bulk crystals, like those shown in FIGS. 1-6, $KNbO_3$ can be temperature tuned to frequency double input wavelengths of 840-950 nm and 960 nm-1060 nm, while $KTiOPO_4$ can be used for wavelengths longer than about 1000 nm. By frequency tuning the diode laser sources, while at the same time temperature tuning the nonlinear crystal material, we can frequency tune the frequency doubled beam over a wavelength range of about 20-50 nm. A smaller range of wavelength tuning is also available for segmented and periodically poled nonlinear optical waveguides. The output from a detector, such as detector 60 in FIG. 5A, detecting the frequency converted light can be used to control the temperature of the nonlinear optical material or the orientation of an external grating, such as grating reflector 103 in FIG. 10, by means of a feedback loop to optimize and stabilize the converted output.

For efficient frequency conversion with nonlinear crystals and particularly for effective light 5 coupling into nonlinear optical waveguides, good spatial modal quality, especially a symmetric beam without astigmatism is required. Such high quality beams are also desired in most other laser applications. Unfortunately, the high power coherent light sources shown in FIGS. 9 and 10 produce a highly asymmetric and astigmatic output beam. The light begins to diverge in the lateral direction parallel to the plane of the active gain region 97 of these devices in the flared amplifier regions 85 and 115, and so have a lateral beam waist positioned at the narrow entrance to the flared regions 85 and 115. However, the light continues to be guided transversely by the thin waveguide layers 93 of the flared regions. The light begins to diverge in the transverse direction perpendicular to the plane of the active region 97 after it exits from the wide end of the flared amplifier regions 85 and 115 and from the output surface 99 and 105 of the source. The transverse beam waist is thus located at the output surface 99 and 105 of the devices, widely spaced away from the lateral beam waist. The output beam is considerably wider in the lateral direction (about 100 $\mu m$) than it is in the transverse direction (about 1 $\mu m$) at the output surface 99 and 105, and the lateral divergence angle (10°-20° FWHM) is smaller than the transverse divergence angle (30°-40° FWHM) of the beam. The astigmatism-correcting optical systems, shown in FIGS. 11-19, are presented as a means for correcting the beam characteristics of the high power sources to produce a symmetric, astigmatism-free beam for efficient use of the frequency doubling configurations shown in FIGS. 1-8 and for other laser applications requiring a good quality high power light beam. While the discussion is directed to MOPA type laser diodes like that shown in FIG. 9, the optical systems discussed are also applicable to flared resonator type laser diodes like that shown in FIG. 10.

Figure 11A:
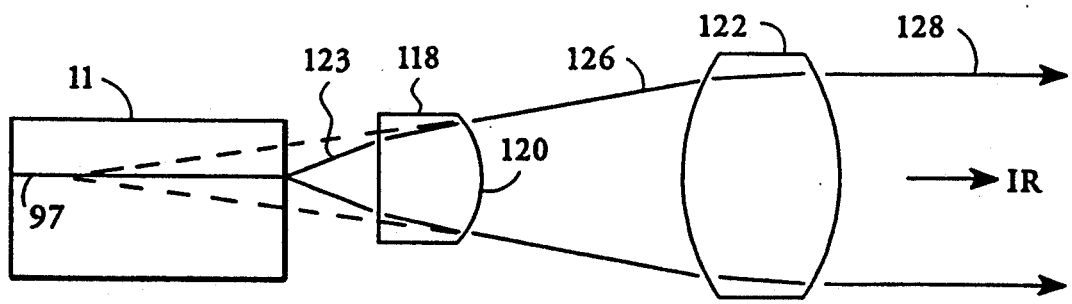
Figure 11B:
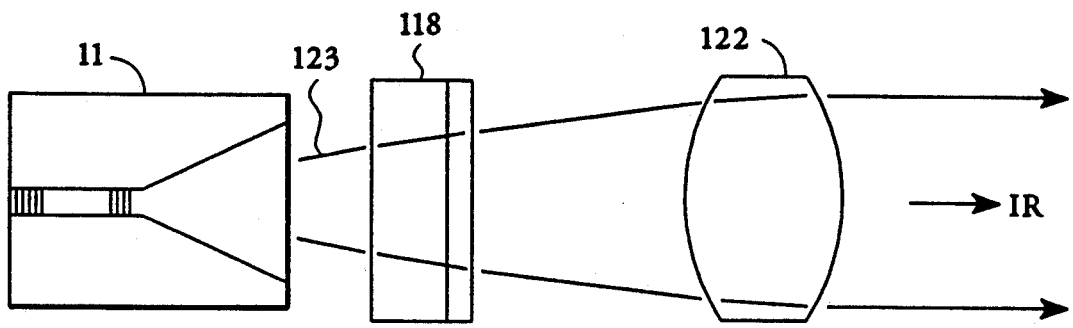

With reference to FIGS. 11A and 11B, a preferred astigmatism-correcting, collimating, lens system for use with the above-described MOPA type and flared resonator type laser diodes 11 comprises an aspherical cylinder lens 118 together with an aspherical collimation lens 122. The light 123 from the laser diode 11 is partially collimated by the cylinder lens 118 in the transverse direction perpendicular to the plane of the active region 97 of the laser diode 11 so that it has substantially the same beam divergence in the transverse direction as it has in the lateral direction parallel to the plane of the active region 97. By placing the cylinder lens 118 at the position where the transverse size dimension of the light beam 123 has expanded to equal the lateral size dimension of the beam 123 and by picking the focal length of the cylinder lens 118 to achieve the aforementioned partial collimation, the output beam 126 from the lens 118 is made symmetric and free of astigmatism. Since the light 123 from the laser diode 11 has a relatively large transverse divergence, the cylinder lens 118 will need to have an aspheric surface 120 to minimize the effect of spherical aberration that is associated with spherical surfaces. Such aspherical cylinder lens can be made, for example, by a process of diamond tuning of a large cylinder lens to create a preform, followed by fiber drawing of this preform, as taught by James Snyder and Patrick Reichert in *SPIE Proceeding* 1991, *Symposium on Optical Applied Science and Engineering.*

After the light 123 from the MOPA type or flared resonator type laser diode 11 has been made symmetric and anastigmatic with the single cylinder lens 118, the light 126 can then be collimated by any diffraction-limited spherically symmetric lens 122 with sufficient numerical aperture. Since the light 126 provided by the laser diode - cylinder lens combination typically has a numerical aperture of about 0.25, the light beam 126 cannot be collimated by a single spherical lens without introducing spherical aberrations. Accordingly, the light beam 126 must be collimated by a single lens 122 with an aspheric surface, as shown, or alternatively by a compound lens element. One advantage of this optical collimation system is that the focal length of the aspherical collimation lens 122 (or the effective focal length of a compound lens element) is a free parameter, so that by changing the focal length of the lens, we can change the spot size of output beam 128. The collimated light 128 can be focused on a nonlinear crystal by a spherical focusing lens or lens system, as shown in FIGS. 1–8.

The two lens system in FIGS. 11A and 11B is very compact, since the individual lenses 118 and 122 are very small, typically less than a few millimeters in size. Although the alignment of the first cylinder lens 118 is critical, the lens 118 is small enough to be easily attached directly to the laser diode 11, thereby providing the necessary long term stability. In the case of direct attachment, the thickness of the lens 118 provides the necessary distance to the aspherical cylinder surface 120 to achieve beam symmetrization and astigmatism-correction. Because of the small size of the cylinder lens 118, the "bowtie" effect, which tends to distort the beam at the corner of the lens, is minimized.

Figure 12A:
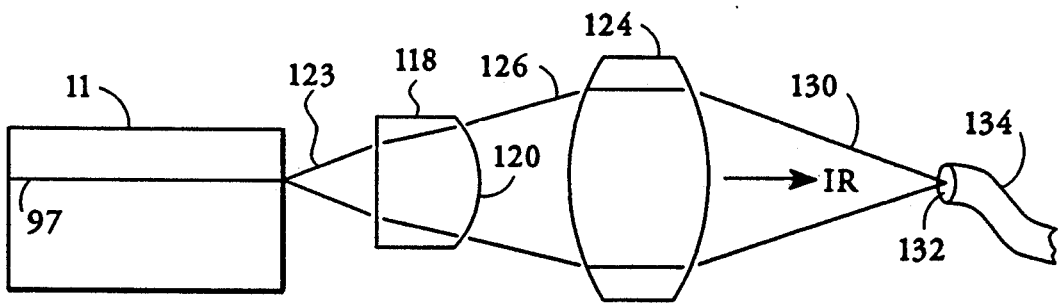
Figure 12B:
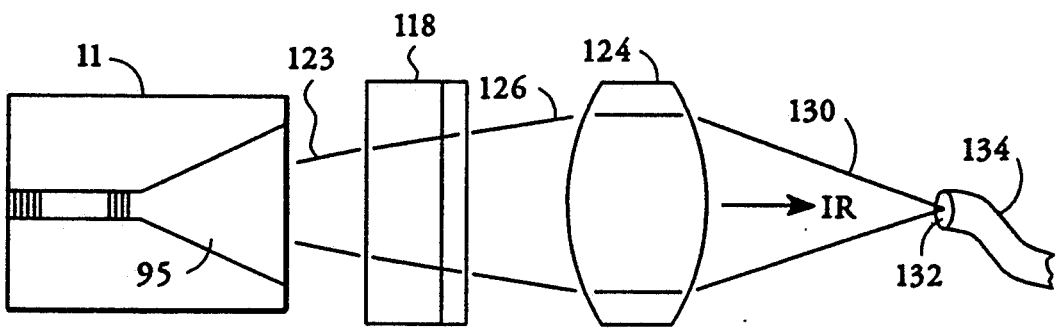

With reference to FIGS. 12A and 12B, after the light 123 from the laser diode 11 has been made symmetric and anastigmatic by the aspheric cylinder lens 118, the nearly collimated light 126 may be focused by a spherically symmetric lens 124 to a small spot for spatially filtering the light 130. Since the light 126 received from the first cylinder lens 118 has a numerical aperture of about 0.25, the spherically symmetric lens 124 should have an aspheric surface to avoid introducing spherical aberration. Alternatively, a second spherical lens could be placed after the aspheric collimating lens 122 in FIGS. 11A and 11B to focus the light. A small pinhole aperture 132 is placed at the focal plane of lens 124 to filter out all light that is not in the main lobe. The light that is not in the main lobe is due to two effects: (1) amplitude and phase distortions introduced as the light is amplified in the flared gain region 95 of the MOPA type or flared resonator type laser diode 11 and (2) distortions introduced by the cylinder lens 118 due to skew rays at the corners of the cylinder lens 118. This latter effect is usually referred to as the "bowtie effect." The pinhole aperture 132 can be a hole in a simple aperture stop, or alternatively as shown, it can be the entrance surface of an optical fiber of the type commonly used in fiberoptic transmission. Light in the main lobe is accepted and transmitted through the core of the optical fiber, while light outside of the main lobe is not incident upon the entrance to the fiber core and so is not transmitted.

Although the amount of light which falls outside of the main lobe is expected to be relatively small, its effect on beam quality may be severe if no spatial filter is used. If no spatial filter 134 is used, the light 130 can still be focused to a small spot, but outside the focal plane the light in side lobes will interfere with light from the main lobe and, because of coherent interference effects, the beam may be severely distorted. This effect has been verified by measuring brightness of the beam, both with and without spatial filtering. Brightness is inversely proportional to the size of the focused spot. It has been found that, without the pinhole aperture 132, the brightness of the beam is reduced.

The effect of the spatial filter 134 is particularly important for the application of frequency doubling and other nonlinear frequency conversion techniques, where the frequency converted beam is generated over a certain interaction length in the nonlinear crystal. Any distortion in the input beam will be further amplified along the length of the crystal, since the non-linear interaction is proportional to the square of the local input intensity. The effect of the pinhole spatial filter 134 may be less important in applications of frequency conversion where the nonlinear crystal is placed in a resonant cavity, as in FIGS. 5A, 5B and 6. This is because the cavity will itself act as a spatial filter for modes which are not matched to the cavity. Light which is not matched to the cavity will not be resonant and thus will not distort the frequency converted output.

Figure 13A:
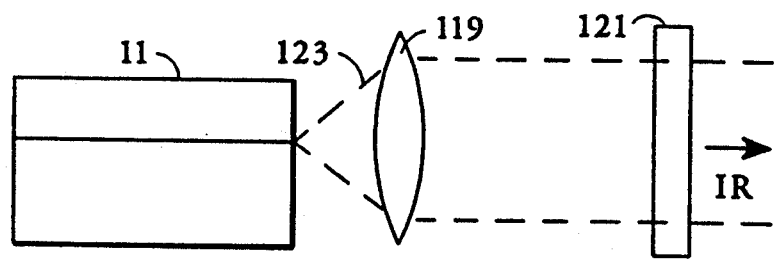
Figure 13B:
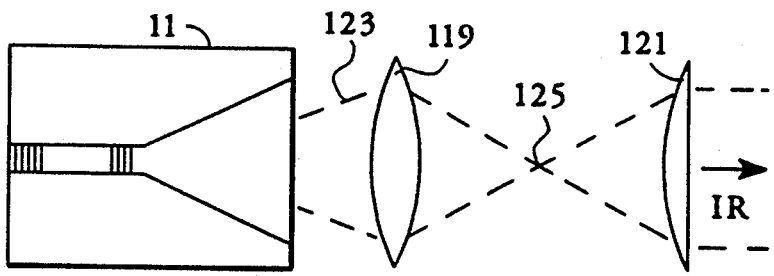

With reference to FIGS. 13A and 13B, a beam from the MOPA device 11 is corrected by a spherical lens 119 followed by a cylinder lens 121. The light 123 from the MOPA device 11 is collected by a spherical lens 119 which is positioned with its focal plane at the output surface 99 of the MOPA device 11. The light in the transverse direction perpendicular to the plane of the active region 97 is collimated and the light in the lateral direction parallel to the plane of the active region 97 is focused to a spot 125 some distance behind the lens. By selecting a cylinder lens 121 with the proper lateral focal length and positioning the cylinder lens 121 a focal distance from the focal point 125 of the light 123, the output beam can be both circularized as well as corrected for astigmatism. In particular, the cylinder lens 121 is positioned beyond the focal point 125 where the lateral beam width has reexpanded to substantially equal the transverse beam width. The focal length is then the distance from the focal point 125 to this position. The first spherical lens 119 can be either an asphere or a compound lens which is diffraction limited for NA=0.6. Since the light incident on the lens 119 has large astigmatism, the lens 119 has to be corrected to be diffraction limited for both infinite and finite conjugate distance.

Figure 14A:
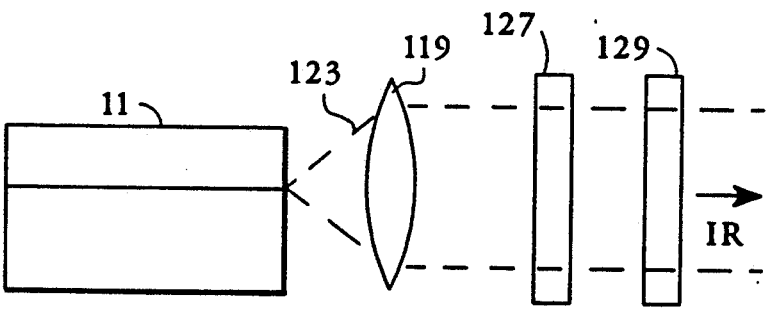
Figure 14B:
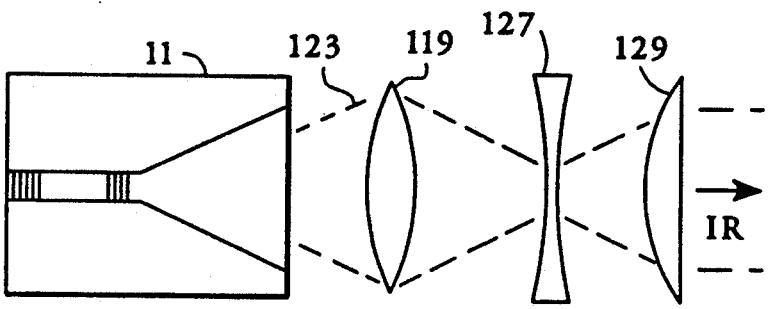

The optical system seen in FIGS. 13A and 13B may be very long since, the beam has to diverge in the lateral direction until it has the same lateral and transverse beam widths. The system length can be made shorter using a short focal length spherical lens 119. Another method to decrease the length of the optical system is by including a negative cylinder lens 127 in the system. A schematic diagram of this configuration is shown in FIGS. 14A and 14B. By including the negative cylinder lens 127 before a second positive cylinder lens 129 and with appropriate choice of the relative focal lengths and the distances between the lenses, we can reduce the length of the system to 1 or 2 cm. The positive cylinder lens 129 is again positioned where the light beam 123 has been reexpanded by the negative cylinder lens 127 in the lateral direction to have substantially identical lateral and transverse beam width dimensions. The positive cylinder lens has a lateral focal length which is equal to the effective optical distance from the lateral focus reimaged by the negative cylinder lens 127 to the position of the positive cylinder lens 129. The two cylinder lenses 127 and 129 with opposing sign focal lengths are the equivalent to a single long focal length cylinder lens 121, however the physical distances are greatly reduced. This is similar to the technique used in photographic tele-lenses to make the lenses shorter, with distinction that here we use a cylinder system 127 and 129 and we use it to correct for astigmatism and beam symmetry. As in the first configuration shown in FIGS. 13A and 13B, the first lens 119 in FIGS. 14A and 14B may be a compound lens optimized for finite and infinite conjugate distance, or the lens 119 may be a single asphere. After the focal length of the lenses and their position has been determined using paraxial optics, the shape of the lenses may be optimized such as to minimize the spherical aberrations of the complete lens system.

Figure 15A:
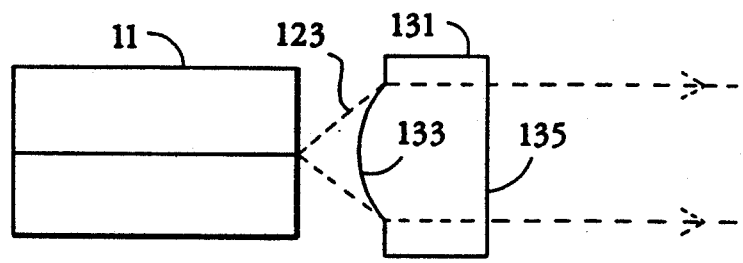
Figure 15B:
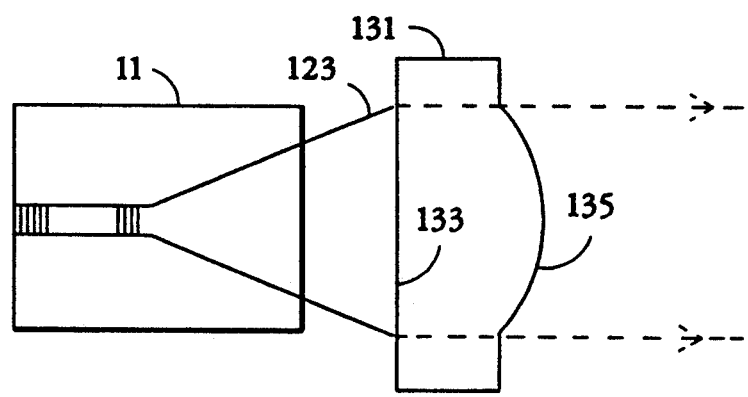

With reference to FIGS. 15A and 15B the optical system can be made even smaller with the use of micro lenses. The schematic diagram in FIGS. 15A and 15B shows the MOPA device 11 followed by a micro-lens 131 with two crossed cylinder lens surfaces 133 and 135 on a single substrate. The first cylinder lens surface 133 collimates the light in the transverse direction, while the second crossed cylinder lens surface 135 collimates the light in the lateral direction. By choosing the appropriate focal lengths and the thickness of the substrate, the output beam from the micro-lens 131 can be made both symmetric as well as corrected for astigmatism. In particular, the first cylinder lens surface 133 is positioned at a distance from the output surface of the MOPA device 11 at which the transverse width dimension of the light beam 123 has expanded to substantially equal the lateral width dimension at the second surface 135 (taking into account the thickness of the microlens substrate). Cylinder lens surface 133 has a transverse focal length substantially equal to the distance from the output surface of the MOPA device to the surface 133. The second cylinder lens surface 135 has a lateral focal length substantially equal to the effective optical distance of the light path from the narrow input end of the flared amplifier region 85 at the output of oscillator 83 within the MOPA device 11 through the output surface of the MOPA device to the second cylinder lens surface 135.

Figure 16A:
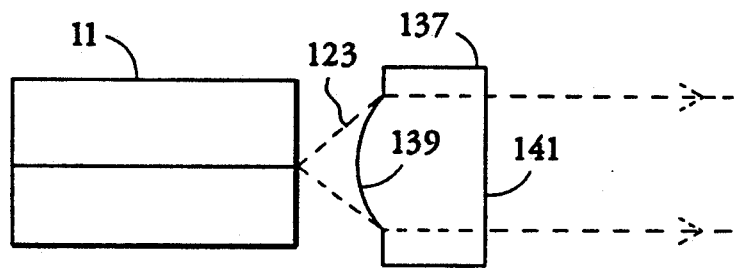
Figure 16B:
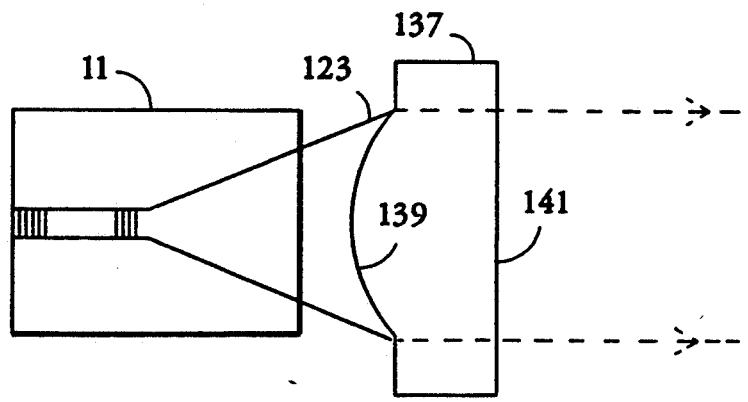

FIGS. 16A and 16B show a second preferred configuration comprising a microlens 137 with a single anamorphic lens surface 139 and a planar surface 141. Since the light 123 emitted from the MOPA device 11 has different lateral and transverse divergence angles, the beam 123 will become dimensionally symmetric after a certain distance. By placing a single anamorphic lens surface 139 at this distance the beam 123 will be symmetric without astigmatism. This lens could be made, for example, using binary optics. Binary optics can also compensate for spherical distortions or bowtie effects that might otherwise occur with conventional cylinder lenses or anamorphic lenses.

Figure 17A:
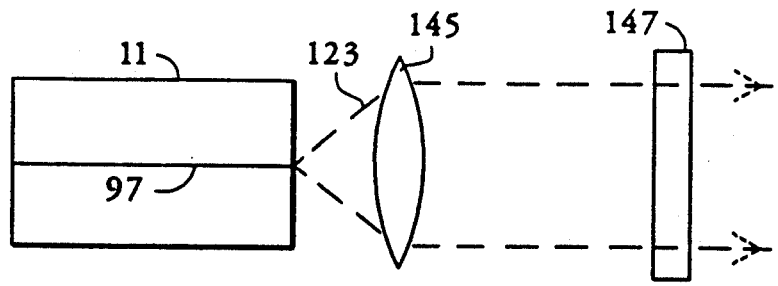
Figure 17B:
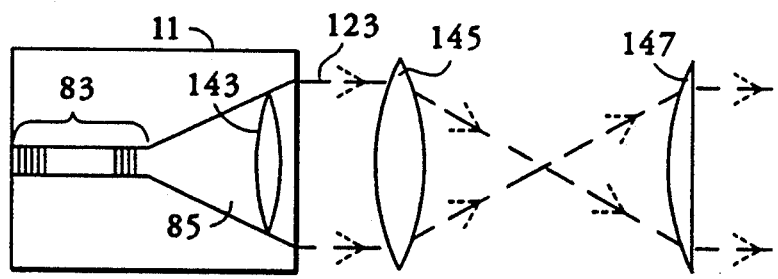
Figure 18A:
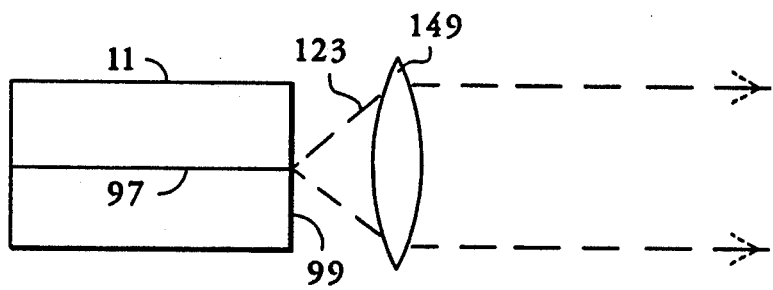
Figure 18B:
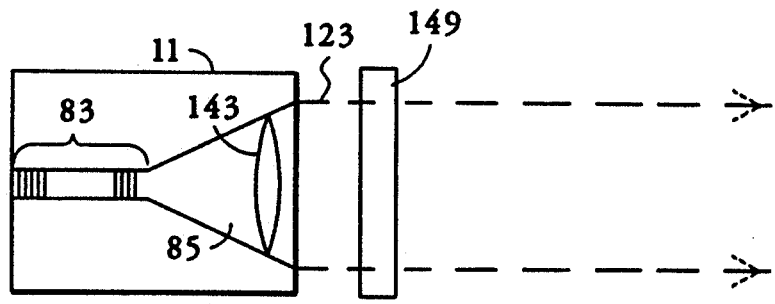

Another method of optimizing the astigmatic beam is by incorporating part of the optics within the flared amplifier 85. In FIGS. 17A, 17B, 18A and 18B, the light in the lateral direction parallel to the plane of the active region 97 of the MOPA device 11 is collimated by an integrated cylinder lens 143 at the end of the flared gain region 85. FIGS. 17A and 17B show a configuration where a bulk spherical lens 145 is used to collimate the light 123 from the MOPA device 11 in the transverse direction. A configuration similar to that shown in FIGS. 13A and 13B or FIGS. 14A and 14B can also be used to make the beam symmetric. The advantage of the integrated lens 143 is that the light is laterally collimated before it passes the GaAs-air interface 99 and before it reaches the spherical lens 145. The low divergence will minimize the spherical aberrations. Using an integrated lens 143, the light 123 from the MOPA device 11 can also be circularized and corrected for astigmatism with a single micro cylinder lens 149 as shown schematically in FIGS. 18A and 18B.

Figure 19:
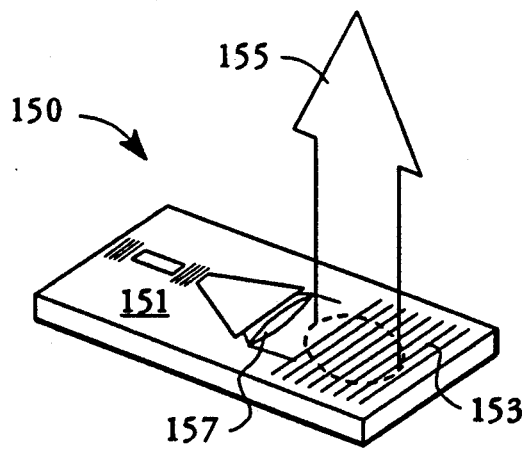
FIGS. 19-21 are perspective views of yet further surface-emitting MOPA/lens-system combinations in accord with the present invention, that include integrating lens and grating elements in the MOPA device.
Figure 20:
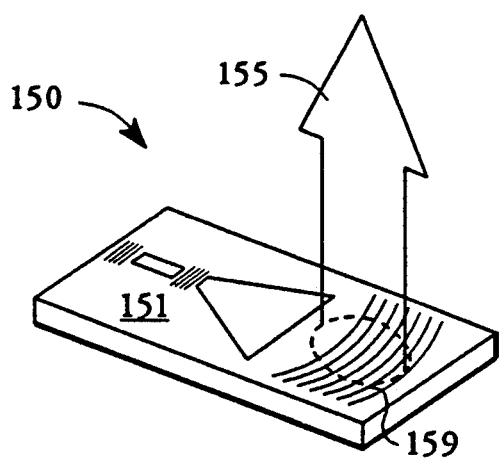
Figure 21:
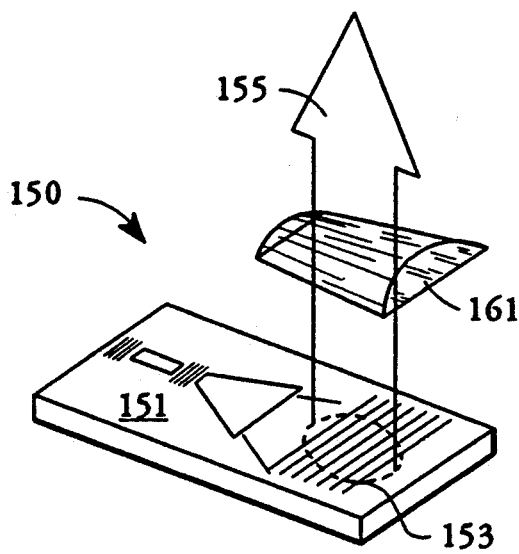

With reference to FIGS. 19-21, the beam 155 can also be coupled out from the top or bottom surface 151 of a MOPA device 150 via a detuned diffraction grating 153 or 159.

FIG. 19 shows a way of coupling a collimated beam 155 vertically out from the surface 151 of MOPA device 150. An integrated lens 157 is fabricated within the MOPA device 150 to laterally collimate the light on-chip. The resulting beam impinges upon a straight periodic grating 153 that diffracts a two-dimensionally collimated beam 155 upward.

FIG. 20 shows another way of coupling a collimated beam 155 out of the surface 151 by using a curved diffraction grating 159. The curvature and pitch of the grating 159 are chosen so that the diffracted output beam 155 is perfectly collimated. In particular the grating teeth curve to match phase fronts of the laterally diverging light.

FIG. 21 illustrates another method. The expanding beam leaving the flared amplifier region impinges upon a straight grating 153 and is diffracted upward. The resulting output beam 155 is subsequently collimated by an external cylindrical or conical lens 161.

Figure 22:
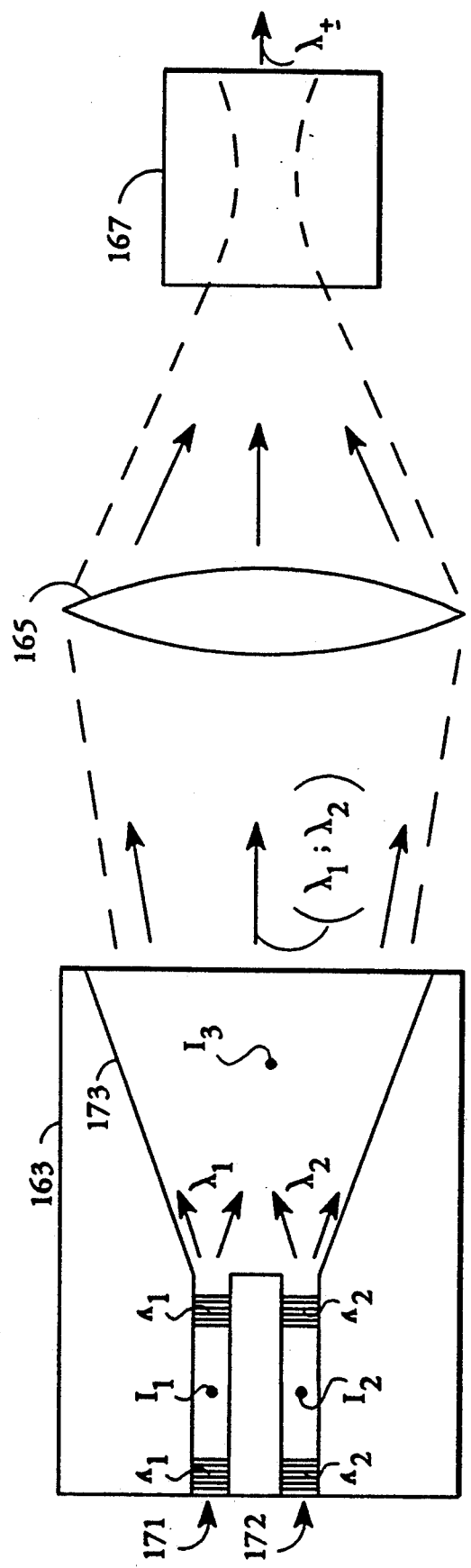
FIGS. 22-24 are top plan views of further embodiments of the present invention.

With reference to FIG. 22, a MOPA device 163 has at least two semiconductor laser oscillators 171 and 172 optically coupled to a semiconductor optical power amplifier 173. The laser oscillators 171 and 172 have DBR grating reflectors with different grating pitches $\Lambda_1$ and $\Lambda_2$ that are selected to cause the laser oscillators 171 and 172 to oscillate at and emit different wavelengths $\lambda_1$ and $\lambda_2$ of light. One or more of the laser oscillators 171 and 172 could be wavelength tunable by applying a tuning current or bias voltage to one or more of the DBR gratings so as to alter their effective pitch and wavelength reflection response. The laser oscillators 171 and 172 are excited by injection of currents $I_1$ and $I_2$ into a gain region of the laser oscillators, which currents $I_1$ and $I_2$ could be independent of one another. In this way, one or both of the laser oscillators 171 and 172 can be selected to emit light so as to provide one or both wavelengths $\lambda_1$ and $\lambda_2$ to the optical power amplifier 173. The amplifier 173 has an active width or lateral aperture that allows the lightwaves received from one or both of the oscillators 171 and 172 to expand laterally by diffraction, at least along a portion of the amplifier region 173. Preferably, the amplifier region 173 is flared so as to have a wider lateral aperture at its output end than the aperture width at its input end adjacent to the laser oscillators 171 and 172. The amplifier 173 is excited to provide gain to the lightwaves by an injection current $I_3$ applied to at least a portion of the amplifier region 173, which preferably is independent of the currents $I_1$ and $I_2$ that are applied to the laser oscillators 171 and 172. Two or more different currents could also be applied to different portions of the amplifier region 173. The MOPA device 163 thus provides a high power coherent light output of one or more selected wavelengths $\lambda_1$ and $\lambda_2$. A lens system 165, like any of the lens systems shown in FIGS. 11-21, provides a collimated or focused, anastigmatic, symmetric light beam to a nonlinear crystal 167.

The nonlinear crystal material 167 may be arranged in any of the configurations shown in FIGS. 1-8 and converts the frequencies or wavelengths of the light it receives to different frequencies and wavelengths. In particular, if the MOPA device 163 is selectively excited to produce high power coherent light at only one of the two or more wavelengths $\lambda_1$ and $\lambda_2$ that it can generate, then the nonlinear crystal 167 performs frequency doubling of the input light and efficiently generates an output beam of wavelength $\lambda_1/2$ or $\lambda_2/2$. In another instance, if the MOPA device 163 is selectively excited to generate both wavelengths $\lambda_1$ and $\lambda_2$, then the nonlinear crystal 167 performs sum or difference frequency mixing of the two wavelengths $\lambda_1$ and $\lambda_2$ and efficiently generates light at one of two new wavelengths $\lambda_+$ or $\lambda_{-1}$ as in the configuration in FIG. 6 described above. These new wavelengths are given by $$\lambda_+ = \frac{\lambda_1 \cdot \lambda_2}{\lambda_1 + \lambda_2}$$

for sum frequency mixing, and $$\lambda_- = \frac{\lambda_1 \cdot \lambda_2}{|\lambda_1 - \lambda_2|}$$

for difference frequency mixing.

Which of the two wavelengths is generated efficiently depends on which wavelength $\lambda_+$ or $\lambda_-$ is phase matched or quasi-phase matched to the input light. Wavelength tuning of one or both of the input wavelengths $\lambda_1$ and $\lambda_2$ can be used to tune the selected frequency mixed output wavelength $\lambda_+$ or $\lambda_-$ provided phase matching or quasi-phase matching is substantially maintained. While the nonlinear crystal 167 is shown in a single pass configuration in FIG. 22, other configurations like the external resonant cavity configuration of FIG. 6 or waveguide configuration could be used.

Figure 23:
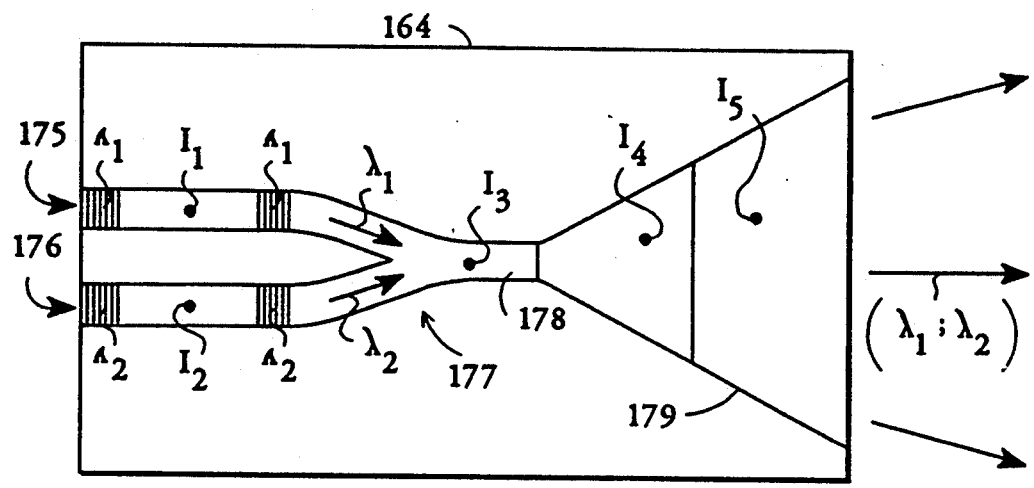

In FIG. 22, the laser oscillators 171 and 172 are spaced apart from one another by a small center-to-center distance of preferably 10 μm or less. Alternatively, as shown in FIG. 23, two laser oscillators 175 and 176 having DBR grating reflectors of different grating pitches $\Lambda_1$ and $\Lambda_2$ and emitting different wavelengths $\lambda_1$ and $\lambda_2$ of light could be combined in a Y-junction combiner 177 into a single waveguide 178. The light of both wavelengths $\lambda_1$ and $\lambda_2$ is then optically coupled from the waveguide 178 into a semiconductor optical power amplifier 179. As in FIG. 22, the power amplifier 179 is preferably flared so as to have a wider lateral aperture at its output end than the aperture width at its input end adjacent to the waveguide 178. Different sections of the MOPA device 164 can be excited by independent currents $I_1$, $I_2$, $I_3$, $I_4$ and $I_5$ to provide independent driving of the laser oscillators 175 and 176, preamplification by the waveguide 178 and differential pumping of the amplifier 179. The high power output of wavelengths $\lambda_1$ and $\lambda_2$ can be collimated and focused by an optical system like that shown in FIGS. 11-21 into nonlinear optical material and then converted to light of another wavelength by frequency doubling or mixing processes in the same manner as described for the system in FIG. 22.

The semiconductor material in the MOPA devices 163 and 164, typically GaAs or InGaAs, is itself a nonlinear optical material which causes a certain degree of frequency doubling and sum or difference frequency mixing of the light of wavelengths $\lambda_1$ and $\lambda_2$ generated by the laser oscillators 171, 172, 175 and 176. However, light with higher energy and shorter wavelengths than the bandgap (typically, about 1.4 eV or 860 nm) are attenuated, and the semiconductor material is transparent only to the wavelengths $\lambda_1$ and $\lambda_2$, when pumped above a transparency threshold, and to the longer wavelength (mid-IR) difference frequency mixed light $\lambda_-$. The difference frequency mixing that does occur is relatively inefficient, is normally not phase-matched, and the converted light at wavelength $\lambda_-$ receives no gain directly from the amplifier region but only from the conversion itself. Accordingly, this mixing can generally be ignored, the new wavelengths being provided primarily by the external non-linear optical material 167.

Figure 24:
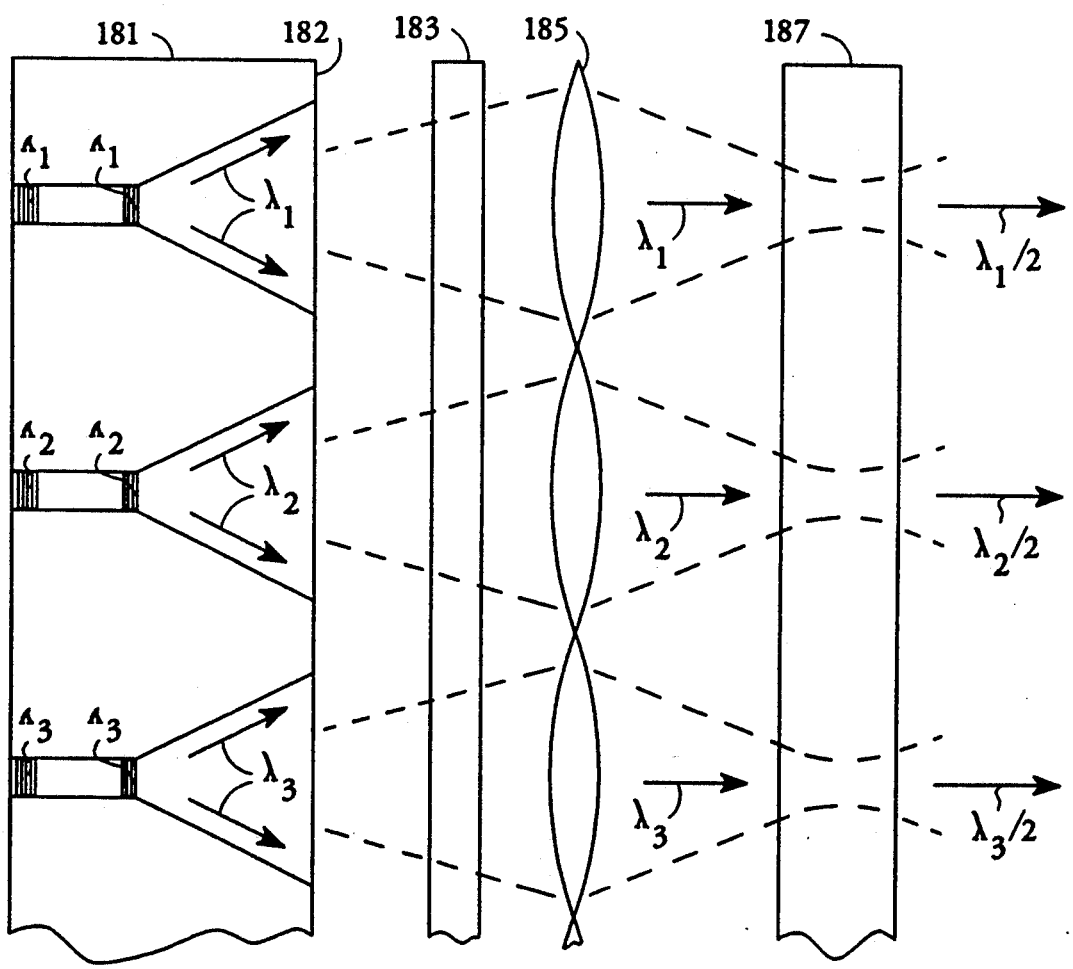

With reference to FIG. 24, a DBR laser array 181 of the MOPA type generates a plurality of high power laser beams of either the same or different wavelengths $\lambda_1$, $\lambda_2$, $\lambda_3$, etc., the pitches $\Lambda_1$, $\Lambda_2$, $\Lambda_3$, etc. of the DBR grating reflectors in the array 181 determining the output wavelength or wavelengths $\lambda_1$, $\lambda_2$, $\lambda_3$, etc. A cylinder lens 183 positioned approximately one focal length from the output facet 182 of the array 181 collimates the highly divergent beams in the transverse direction. The first cylinder lens 183 is followed by a spherical lens array 185 to bring the beams to a focus inside a nonlinear optical material frequency doubler 187. The output from the doubler 187 is an array of ultraviolet, blue or green light spots of the same or different wavelengths $\lambda_1/2$, $\lambda_2/2$, $\lambda_3/2$, etc. In an alternative configuration, a cylinder lens array could be used in place of the spherical lens array 185 to provide lateral focusing.

We claim:

1. A coherent light source comprising
   at least one semiconductor optical source generating and emitting an optical output with a single transverse and lateral mode, said optical output being emitted from an optical aperture of said at least one semiconductor optical source with a lateral-to-transverse emission ratio of at least 10 to 1,
   means for exciting said at least one semiconductor optical source to generate said optical output,
   a nonlinear optical material, and
   optical coupling means for coupling said optical output from said at least one semiconductor optical source into said nonlinear optical material.

2. The coherent light source of claim 1 wherein at least one of said semiconductor optical source contains a flared optical power amplifier.

3. The coherent light source of claim 1 wherein at least one said semiconductor optical source is an at most marginally stable optical resonator with a spatial mode filter.

4. The coherent light source of claim 1 wherein at least one of said semiconductor optical sources is wavelength tunable.

5. The coherent light source of claim 1 wherein said optical coupling means also corrects for astigmatism of said optical output from said at least one semiconductor optical source between orthogonal transverse and lateral directions defined by said at least one semiconductor optical source.

6. The coherent light source of claim 5 wherein said optical coupling means also focuses said optical output to transverse and lateral beam waists located within said nonlinear optical material.

7. The coherent light source of claim 1 wherein said excitation means includes means for modulating the optical output from at least one said semiconductor optical source.

8. The coherent light source of claim 7 wherein said excitation means further includes means for electrically exciting at least one said semiconductor optical source with at least one different current density along a length of said semiconductor optical source.

9. The coherent light source of claim 1 wherein said nonlinear optical material is located within a resonant optical cavity.

10. The coherent light source of claim 9 wherein said resonant optical cavity is configured as a ring resonant cavity.

11. The coherent light source of claim 9 wherein said resonant optical cavity is configured as a linear resonant cavity.

12. The coherent light source of claim 1 wherein said nonlinear optical material includes a nonlinear material optical waveguide with polarization domain reversals.

13. The coherent light source of claim 12 wherein said polarization domain reversals are substantially periodic.

14. The coherent light source of claim 12 wherein said polarization domain reversals occur with a variable periodicity, whereby frequency conversion is allowed for a broad band of input wavelengths.

15. A semiconductor laser comprising
 a master oscillator power amplifier (MOPA) device capable of generating a high power asymmetric coherent light beam of a first wavelength, and
 an optical frequency converter positioned to receive said high power coherent light beam from said MOPA device and capable of generating a second light beam from a portion of the power of said high power light beam, said second light beam having a second wavelength different from said first wavelength.

16. The laser of claim 15 wherein said MOPA device includes a single mode DBR laser oscillator.

17. The laser of claim 15 wherein said MOPA device includes a multimode power amplifier region.

18. The laser of claim 15 wherein said multimode amplifier region is a flared amplifier region.

19. The laser of claim 15 wherein said frequency converter is a second harmonic generator.

20. The laser of claim 19 wherein said second harmonic generator comprises a bulk crystal of optically nonlinear material.

21. The laser of claim 20 wherein said bulk crystal is located within a resonant optical cavity.

22. The laser of claim 19 wherein said second harmonic generator includes a nonlinear material optical waveguide.

23. The laser of claim 22 wherein said waveguide has periodic ferroelectric polarization domain reversals.

24. The laser of claim 22 wherein said waveguide supports only a single spatial mode of light propagation.

25. The laser of claim 22 wherein said waveguide is a broad area multimode waveguide.

26. The laser of claim 15 wherein said high power coherent light beam of said first wavelength has a light path that passes through said frequency converter only once.

27. The laser of claim 15 wherein said high power beam has a light path that passes through said frequency converter at least twice, reflection means being positioned in said light path of said high power beam for reflecting light of at least said first wavelength back into said frequency converter.

28. The laser of claim 27 wherein said reflection means is highly reflective of light of both said first and second wavelengths.

29. The laser of claim 28 wherein said reflection means comprises a planar mirror, a beamsplitter transmissive of said first wavelength and reflective of said second wavelength being positioned in a return light path of said high power light beam and of said second light beam to couple said second light beam out of said laser as an output beam.

30. The laser of claim 27 wherein said reflection means comprises at least one right-angle retroreflector positioned in said light path to return said high power beam through said frequency converter along a parallel light path.

31. The laser of claim 30 further including means for focussing said light beam in said frequency converter and collimating said light beam for incidence upon said at least one retroreflector.

32. The laser of claim 31 wherein said focussing and collimating means comprises a pair of lens arrays situated in said parallel light paths on opposite sides of said frequency converter.

33. A semiconductor laser comprising
 a master oscillator power amplifier (MOPA) device capable of generating a high power coherent light beam of a first wavelength,
 an optical frequency converter positioned to receive said high power coherent light beam from said MOPA device and capable of generating a second light beam from a portion of the power of said high power light beam, said second light beam having a second wavelength different from said first wavelength, and
 an astigmatism-correcting lens system positioned in said light path between said MOPA device and said frequency converter, said lens system providing a modified laser beam with substantially equal lateral and transverse beam width dimensions and substantially equal lateral and transverse beam divergence angles, where 'lateral' and 'transverse' refer to directions respectively parallel and perpendicular to a plane of an active gain region of said MOPA device.

34. The laser of claim 33 wherein said lens system comprises a first spherical lens positioned with a focal plane thereof at an output surface of said MOPA device so as to collimate the light beam in the transverse direction and to focus the light beam in the lateral direction, and a positive cylinder lens positioned beyond the lateral focus of the light beam where the lateral width dimension of the light beam has re-expanded to be identical to the transverse width dimension of the light beam, said cylinder lens having a positive lateral focal length equal to an effective optical distance from the lateral focus to said cylinder lens so as to collimate the light beam in the lateral direction.

35. The laser of claim 34 wherein said first spherical lens is a compound lens which is diffraction limited for both finite and infinite conjugate distances of said light beam received from said MOPA device.

36. The laser of claim 34 wherein said first spherical lens is a single asphere.

37. The laser of claim 34 wherein said lens system further includes a negative cylinder lens positioned between said lateral focus of said light beam and said positive cylinder lens, said negative cylinder lens having a negative lateral focal length.

38. The laser of claim 33 wherein said lens system comprises a microlens with two crossed positive cylinder lens surfaces formed on opposite sides of a transparent substrate, a first of said cylinder lens surfaces being positioned at a distance from an output surface of said MOPA device at which the transverse width dimension of said light beam has expanded to substantially equal the lateral width dimension of said light beam at a second of said cylinder lens surfaces, said first cylinder lens surface having a transverse focal length substantially equal to the distance from said output surface of said MOPA device to said first cylinder lens surface so as to collimate the light beam in the transverse direction, said second cylinder lens surface having a lateral focal length substantially equal to the effective optical distance of the light path from an input end of a power amplifier within said MOPA device through said output surface to said second cylinder lens surface so as to collimate the light beam in the lateral direction.

39. The laser of claim 33 wherein said lens system comprises a microlens with a positive toric lens surface and a planar surface on opposite sides of a transparent substrate, said toric lens surface being positioned at a first effective optical distance of the light path from an output surface of said MOPA device thereto where the transverse width dimension of said light beam has expanded to substantially equal the lateral width dimension, said toric lens surface having a transverse focal length substantially equal to said first effective optical distance so as to collimate the light beam in the transverse direction, said toric lens surface also having a lateral focal length substantially equal to a second effective optical distance from an input end of a power amplifier within said MOPA device to said toric lens surface so as to also collimate the light beam in the lateral direction.

40. The laser of claim 33 wherein said MOPA device includes a lens integrated therein at an output end of a power amplifier of said MOPA device, said lens having a lateral focal length in said device substantially equal to an effective optical distance from an input end of said power amplifier to said lens so as to collimate the light in the lateral direction prior to being emitted from an output surface of said MOPA device.

41. The laser of claim 40 wherein said lens system comprises a cylinder microlens positioned in the light path at a distance where the transverse width dimension of the light beam has expanded to substantially equal the lateral width dimensions and having a transverse focal length substantially equal to said distance so as to collimate said light beam in the transverse direction.

42. The laser of claim 40 wherein said lens system comprises a first spherical lens having a positive focal length equal to a distance from said output surface of said MOPA device to said first spherical lens so as to collimate the light beam in the transverse direction and to focus the light beam in the lateral direction, and a positive cylinder lens positioned beyond the lateral focus of the light beam where the lateral width dimension of the light beam has reexpanded to be substantially identical to the transverse width dimension of the light beam, said cylinder lens having a positive lateral focal length substantially equal to an effective optical distance from the lateral focus to said cylinder lens so as to collimate the light beam in the lateral direction.

43. The laser of claim 40 wherein said MOPA device further includes a surface emitting detuned grating output coupler positioned to receive said laterally collimated light from said integral lens and to direct the light vertically out of a top or bottom surface of said MOPA device.

44. The laser of claim 43 wherein said grating output coupler has a grating pitch and overall length selected so that the vertically directed output light beam from said MOPA device has substantially symmetric width dimensions.

45. The laser of claim 15 wherein said MOPA device includes a surface emitting detuned grating output coupler positioned at an output end of a power amplifier of said MOPA device to receive light therefrom and direct the light vertically out of a top or bottom surface of said MOPA device.

46. The laser of claim 45 wherein said grating output coupler has plural, periodically spaced grating teeth, each grating tooth being curved to coincide with a lateral phase front of the light so as to collimate the vertically directed light beam in the lateral direction.

47. The laser of claim 45 wherein said grating output coupler has plural, periodically spaced, parallel, straight grating teeth, said laser further comprising a cylinder lens in the path of the vertically directed output light beam with a lateral focal length substantially equal to an effective optical distance along the light path to an input end of said power amplifier of said MOPA device so as to collimate the output light beam in the lateral direction.

48. A semiconductor laser comprising
a master oscillator power amplifier (MOPA) device having a single mode laser oscillator and a multimode optical power amplifier region coupled to said laser oscillator capable of generating a high power coherent light beam, said light beam characterized by differing lateral and transverse beam width dimensions and differing lateral and transverse beam divergence angles, with a lateral beam waist located at an input end of said power amplifier region proximate to said laser oscillator and with a transverse beam waist located at an output surface of said MOPA device, where 'lateral' and 'transverse' refer to directions respectively parallel and perpendicular to a plane of an active gain region of said MOPA device, and
an astigmatism-correcting lens system positioned in the path of said light beam output from said MOPA device, said lens system adapted to provide a modified laser beam with substantially equal lateral and transverse beam width dimensions and substantially equal lateral and transverse beam divergence angles.

49. The laser of claim 48 wherein said MOPA device includes a single mode DBR laser oscillator.

50. The laser of claim 48 wherein said MOPA device includes a multimode power amplifier region.

51. The laser of claim 50 wherein said multimode amplifier region is a flared amplifier region.

52. The laser of claim 48 wherein said lens system comprises a first spherical lens positioned with a focal plane thereof at an output surface of said MOPA device so as to collimate the light beam in the transverse direction and to focus the light beam in the lateral direction, and a positive cylinder lens positioned beyond the lateral focus of the light beam where the lateral width dimension of the light beam has re-expanded to be identical to the transverse width dimension of the light beam, said cylinder lens having a positive lateral focal length equal to an effective optical distance from the lateral focus to said cylinder lens so as to collimate the light beam in the lateral direction.

53. The laser of claim 52 wherein said first spherical lens is a compound lens which is diffraction limited for both finite and infinite conjugate distances of said light beam received from said MOPA device.

54. The laser of claim 52 wherein said first spherical lens is a single asphere.

55. The laser of claim 52 wherein said lens system further includes a negative cylinder lens positioned between said lateral focus of said light beam and said positive cylinder lens, said negative cylinder lens having a negative lateral focal length.

56. The laser of claim 48 wherein said lens system comprises a microlens with two crossed positive cylinder lens surfaces formed on opposite sides of a transparent substrate, a first of said cylinder lens surfaces being positioned at a distance from an output surface of said MOPA device at which the transverse width dimension of said light beam has expanded to substantially equal the lateral width dimension of said light beam at a second of said cylinder lens surfaces, said first cylinder lens surface having a transverse focal length substantially equal to the distance from said output surface of said MOPA device to said first cylinder lens surface so as to collimate the light beam in the transverse direction, said second cylinder lens surface having a lateral focal length substantially equal to the effective optical distance of the light path from an input end of a power amplifier within said MOPA device through said output surface to said second cylinder lens surface so as to collimate the light beam in the lateral direction.

57. The laser of claim 48 wherein said lens system comprises a microlens with a positive toric lens surface and a planar surface on opposite sides of a transparent substrate, said toric lens surface being positioned at a first effective optical distance of the light path from an output surface of said MOPA device thereto where the transverse width dimension of said light beam has expanded to substantially equal the lateral width dimension, said toric lens surface having a transverse focal length substantially equal to said first effective optical distance so as to collimate the light beam in the transverse direction, said toric lens surface also having a lateral focal length substantially equal to a second effective optical distance from an input end of a power amplifier within said MOPA device to said toric lens surface so as to also collimate the light beam in the lateral direction.

58. The laser of claim 48 wherein said MOPA device includes a lens integrated therein at an output end of a power amplifier of said MOPA device, said lens having a lateral focal length in said device substantially equal to an effective optical distance from an input end of said power amplifier to said lens so as to collimate the light in the lateral direction prior to being emitted from an output surface of said MOPA device.

59. The laser of claim 58 wherein said lens system comprises a cylinder microlens positioned in the light path at a distance where the transverse width dimension of the light beam has expanded to substantially equal the lateral width dimensions and having a transverse focal length substantially equal to said distance so as to collimate said light beam in the transverse direction.

60. The laser of claim 58 wherein said lens system comprises a first spherical lens having a positive focal length equal to a distance from said output surface of said MOPA device to said first spherical lens so as to collimate the light beam in the transverse direction and to focus the light beam in the lateral direction, and a positive cylinder lens positioned beyond the lateral focus of the light beam where the lateral width dimension of the light beam has reexpanded to be substantially identical to the transverse width dimension of the light beam, said cylinder lens having a positive lateral focal length substantially equal to an effective optical distance from the lateral focus to said cylinder lens so as to collimate the light beam in the lateral direction.

61. The laser of claim 58 wherein said MOPA device further includes a surface emitting detuned grating output coupler positioned to receive said laterally collimated light from said integral lens and to direct the light vertically out of a top or bottom surface of said MOPA device.

62. The laser of claim 61 wherein said grating output coupler has a grating pitch and overall length selected so that the vertically directed output light beam from said MOPA device has substantially symmetric width dimensions.

63. The laser of claim 48 wherein said MOPA device includes a surface emitting detuned grating output coupler positioned at an output end of a power amplifier of said MOPA device to receive light therefrom and direct the light vertically out of a top or bottom surface of said MOPA device.

64. The laser of claim 63 wherein said grating output coupler has plural, periodically spaced grating teeth, each grating tooth being curved to coincide with a lateral phase front of the light so as to collimate the vertically directed light beam in the lateral direction.

65. The laser of claim 63 wherein said grating output coupler has plural, periodically spaced, parallel, straight grating teeth, said laser further comprising a cylinder lens in the path of the vertically directed output light beam with a lateral focal length substantially equal to an effective optical distance along the light path to an input end of said power amplifier of said MOPA device so as to collimate the output light beam in the lateral direction.

66. A laser of claim 48 wherein an optical frequency converter is positioned to receive said modified laser beam from said astigmatism-correcting lens system and capable of generating a second light beam from a portion of the power of said modified laser beam, said high power coherent light beam from said MOPA device and said modified laser beam from said lens system being of a first wavelength, said second laser beam generated by said optical frequency converter being of a second wavelength different from said first wavelength.

67. The laser of claim 66 wherein said frequency converter is a second harmonic generator.

68. The laser of claim 67 wherein said second harmonic generator comprises a bulk crystal of optically nonlinear material.

69. The laser of claim 68 wherein said bulk crystal is located within a resonant optical cavity.

70. The laser of claim 67 wherein said second harmonic generator includes a nonlinear material optical waveguide.

71. The laser of claim 70 wherein said waveguide has periodic ferroelectric polarization domain reversals.

72. The laser of claim 70 wherein said waveguide supports only a single spatial mode of light propagation.

73. The laser of claim 70 wherein said waveguide is a broad area multimode waveguide.

74. The laser of claim 66 wherein said high power coherent light beam of said first wavelength has a light path that passes through said frequency converter only once.

75. The laser of claim 66 wherein said high power beam has a light path that passes through said frequency converter at least twice, reflection means being positioned in said light path of said high power beam for reflecting light of at least said first wavelength back into said frequency converter.

76. The laser of claim 75 wherein said reflection means is highly reflective of light of both said first and second wavelengths.

77. The laser of claim 76 wherein said reflection means comprises a planar mirror, a beamsplitter transmissive of said first wavelength and reflective of said second wavelength being positioned in a return light path of said high power light beam and of said second light beam to couple said second light beam out of said laser as an output beam.

78. The laser of claim 75 wherein said reflection means comprises at least one right-angle retroreflector positioned in said light path to return said high power beam through said frequency converter along a parallel light path.

79. The laser of claim 78 further including means for focussing said light beam in said frequency converter and collimating said light beam for incidence upon said at least one retroreflector.

80. The laser of claim 79 wherein said focussing and collimating means comprises a pair of lens arrays situated in said parallel light paths on opposite sides of said frequency converter.

81. A semiconductor laser comprising
at least two semiconductor laser oscillators capable of oscillating at and emitting light beams of different wavelengths,
a semiconductor optical power amplifier optically coupled to said laser oscillators,
excitation means for pumping said laser oscillators and said optical power amplifier,
nonlinear optical material optically coupled to said optical power amplifier to receive high power coherent light therefrom so as to convert at least one wavelength of said light into another wavelength by a nonlinear optical process.

82. The laser of claim 81 wherein at least one of said laser oscillators has means for tuning its oscillation and emission wavelength.

83. The laser of claim 81 wherein said excitation means for said at least two laser oscillators are injection currents that are independent of one another.

84. The laser of claim 81 wherein said amplifier has a lateral aperture width that permits lightwaves received from said laser oscillators to expand laterally by diffraction.

85. The laser of claim 84 wherein said amplifier has a wider lateral aperture at an output end thereof than the lateral aperture width at an input end thereof adjacent to said laser oscillators.

86. The laser of claim 81 wherein said excitation means for said amplifier is at least one injection current applied thereto which is independent from injection currents applied to said laser oscillators.

87. The laser of claim 81 wherein said amplifier is differentially pumped along its length.

88. The laser of claim 81 wherein astigmatism correcting, optical means are disposed between said amplifier and said nonlinear optical material for providing an anastigmatic, symmetric light beam to said nonlinear optical material.

89. The laser of claim 81 wherein said nonlinear optical process is sum frequency mixing.

90. The laser of claim 81 wherein said nonlinear optical process is difference frequency mixing.

91. The laser of claim 81 wherein said excitation means drives only a selected one of said laser oscillators to generate light of a single selected wavelength, said nonlinear optical process being frequency doubling.

92. The laser of claim 81 wherein said at least two semiconductor laser oscillators are closely spaced apart from one another and each laser oscillator couples directly to said amplifier.

93. The laser of claim 81 wherein means for combining said light beams of different wavelengths is positioned between said laser oscillators and said amplifier.

94. A coherent light source comprising
at least two laser sources of different wavelengths, at least one of said laser sources being a semiconductor master oscillator power amplifier (MOPA) device,
excitation means for pumping said laser sources to generate high power coherent light,
a nonlinear optical material, and
means for combining said light from said laser sources in said nonlinear optical material.

95. The coherent light source of claim 94 wherein an amplifier portion of said at least one MOPA device has a lateral aperture width that allows light in said MOPA device to expand laterally at least along a portion of the length of said amplifier portion.

96. The coherent light source of claim 94 wherein at least one of said laser sources is wavelength tunable.

97. The coherent light source of claim 94 wherein said excitation means are capable of providing different excitation levels to different portions of said laser sources.

98. The coherent light source of claim 94 wherein said nonlinear optical material is contained within a resonant cavity.

99. A coherent light source comprising
an array of semiconductor master oscillator power amplifiers (MOPAs), each of said MOPAs in said array emitting light from an output surface of said MOPA which is asymmetric in its beam width between orthogonal transverse and lateral directions defined by said MOPA, with a lateral-to-transverse beam width ratio for said light output of at least 10 to 1 at said output surface,
a nonlinear optical material capable of generating at least one light wavelength that is different from a wavelength of light provided by at least one of said MOPAs, and
optical coupling means for bringing light generated by each of said MOPAs into said nonlinear optical material with a high power density.

100. The coherent light source of claim 99 wherein at least two of said MOPAs emit different wavelengths of light.

101. The coherent light source of claim 99 wherein at least one of said MOPAs is wavelength tunable.

102. The coherent light source of claim 99 wherein at least one of said MOPAs is modulatable.

103. The coherent light source of claim 99 wherein said optical coupling means comprises at least one lens array disposed between said array of MOPAs and said nonlinear optical material.

104. The coherent light source of claim 103 wherein said optical coupling means comprises a cylinder lens for focusing light in a transverse direction perpendicular to said array of MOPAs and a cylinder lens array for focusing said light in a lateral direction parallel to said array of MOPAs, said cylinder lens and said cylinder lens array positioned to provide transverse and lateral beam waists within said nonlinear optical material.

105. The coherent light source of claim 103 wherein said optical coupling means comprises a cylinder lens for collimating light in a transverse direction perpendicular to said array of MOPAs and a spherical lens array positioned with respect to said cylinder lens so as to bring light beams from said array of MOPAs to a focus inside said nonlinear optical material.

106. The coherent light source of claim 99 wherein a single diffraction lens array brings at least one beam from said array of MOPAs to a focus in said nonlinear optical material.

107. A coherent light source comprising
at least one monolithic semiconductor master oscillator power amplifier (MOPA) device,
means for exciting said at least one MOPA device to generate and emit an optical output, said optical output from said at least one MOPA device being asymmetric in its beam width between orthogonal transverse and lateral directions defined by said MOPA device, with a lateral-to-transverse beam width ratio for said optical output of at least 10 to 1 at an optical output aperture of said at least one MOPA device,
a nonlinear optical material contained within a resonant optical cavity, and
optical coupling means for matching the optical output from said at least one MOPA device to said resonant optical cavity containing said nonlinear optical material.

108. The coherent light source of claim 107 wherein at least one said MOPA device includes a multimode optical power amplifier.

109. The coherent light source of claim 107 wherein at least one said MOPA device includes a flared optical power amplifier.

110. The coherent light source of claim 107 wherein at least one said MOPA device is wavelength tunable and said excitation means includes means for tuning the wavelength of said optical output from said at least one wavelength tunable MOPA device to match a resonant condition of said resonant optical cavity containing said nonlinear optical material.

111. The coherent light source of claim 107 said optical coupling means focuses said optical output to transverse and lateral beam waists located within said resonant optical cavity containing said nonlinear optical material, said transverse and lateral beam waists of said focused optical output matching beam waists established by said resonant optical cavity.

112. The coherent light source of claim 111 wherein said optical coupling means also corrects for astigmatism of said optical output from said at least one MOPA device between orthogonal transverse and lateral directions of said optical output defined by said MOPA device.

113. The coherent light source of claim 112 wherein said optical coupling means includes an adjustable lens system for providing said astigmatism correction.

114. The coherent light source of claim 107 wherein said optical coupling means includes at least one optical element monolithically integrated with at least one said MOPA device.

115. The coherent light source of claim 114 wherein said monolithically integrated optical element has means for electronically controlling an optical parameter of said optical element so as to be able to optimize coupling of said optical output to said resonant optical cavity containing said nonlinear optical material.

116. The coherent light source of claim 107 wherein said resonant optical cavity is a ring resonant cavity.

117. The coherent light source of claim 107 wherein said resonant optical cavity is a linear resonant cavity.

118. A coherent light source comprising
at least one monolithic semiconductor master oscillator power amplifier (MOPA) device,
means for exciting said at least one MOPA device to generate and emit an optical output,
a nonlinear optical material contained within a resonant optical cavity, said resonant optical cavity having at least one reflector with greater than 50% reflectivity to light of the wavelength of the optical output from said at least one MOPA device,
optical coupling means for matching the optical output from said at least one MOPA device to said resonant optical cavity containing said nonlinear optical material.

119. The coherent light source of claim 107 wherein said excitation means includes means for separately modulating at least one region of an optical power amplifier of said MOPA device.

* * * * *